(12) United States Patent
Suzawa et al.

(10) Patent No.: US 6,809,339 B2
(45) Date of Patent: Oct. 26, 2004

(54) SEMICONDUCTOR DEVICE AND METHOD FOR MANUFACTURING SAME

(75) Inventors: Hideomi Suzawa, Kanagawa (JP); Koji Ono, Kanagawa (JP); Toru Takayama, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 10/746,182

(22) Filed: Dec. 29, 2003

(65) Prior Publication Data

US 2004/0135216 A1 Jul. 15, 2004

Related U.S. Application Data

(62) Division of application No. 09/852,282, filed on May 10, 2001.

(30) Foreign Application Priority Data

May 12, 2000 (JP) .................................... 2000-140999
Jun. 27, 2000 (JP) .................................... 2000-193614

(51) Int. Cl.⁷ .................... H01L 29/04; H01L 29/76; H01L 23/58
(52) U.S. Cl. .................... 257/72; 257/59; 257/66; 257/69; 257/72; 257/192; 257/259; 257/262; 257/646; 257/650
(58) Field of Search ............ 257/20, 69, 192, 257/259, 262, 274, 296, 302, 326, 338, 351, 353–357, 360, 365, 366, 369, 390, 646, 650

(56) References Cited

U.S. PATENT DOCUMENTS

| | | | |
|---|---|---|---|
| 4,394,182 A | 7/1983 | Maddox, III | |
| 4,963,504 A | 10/1990 | Huang | |
| 5,112,766 A | 5/1992 | Fujii et al. | |
| 5,182,619 A | 1/1993 | Pfiester | |
| 5,185,058 A | 2/1993 | Cathey, Jr. | |

(List continued on next page.)

FOREIGN PATENT DOCUMENTS

| | | |
|---|---|---|
| JP | 06-148685 | 5/1994 |
| JP | 07-235680 | 9/1995 |
| JP | 08-274336 | 10/1996 |
| JP | 09-293600 | 11/1997 |
| JP | 10-233511 | 9/1998 |
| WO | WO 87/07079 | 11/1987 |

OTHER PUBLICATIONS

Hatano et al., "A Novel Self–aligned Gate–overlapped LDD Poly–Si TFT with High Reliability and Performance", IEDM Technical Digest 97, pp. 523–526.

Hideomi Suzawa et al., "Semiconductor Device and Manufacturing Method Thereof," U.S. patent application Ser. No. 09/852,672, filed May 11, 2001, Publication No. US–2001–0041392–A1, published Nov. 15, 2001, Pending.

*Primary Examiner*—John F. Niebling
*Assistant Examiner*—Stanetta Isaac
(74) *Attorney, Agent, or Firm*—Fish & Richardson P.C.

(57) ABSTRACT

In the fabrication of semiconductor devices such as active matrix displays, the need to pattern resist masks in photolithography increases the number of steps in the fabrication process and the time required to complete them and consequently represents a substantial cost. This invention provides a method for forming an impurity region in a semiconductor layer 303 by doping an impurity element into the semiconductor layer self-aligningly using as a mask the upper layer (a second conducting film 306) of a gate electrode formed in two layers. The impurity element is doped into the semiconductor layer through the lower layer of the gate electrode (a first conducting film 305), and through a gate insulating film 304. By this means, an LDD region 313 of a GOLD structure is formed in the semiconductor layer 303.

20 Claims, 12 Drawing Sheets

U.S. PATENT DOCUMENTS

| | | |
|---|---|---|
| 5,272,100 A | 12/1993 | Satoh et al. |
| 5,302,240 A | 4/1994 | Hori et al. |
| 5,378,309 A | 1/1995 | Rabinzohn |
| 5,543,340 A | 8/1996 | Lee |
| 5,581,092 A | 12/1996 | Takemura |
| 5,583,067 A | 12/1996 | Sanchez |
| 5,599,741 A | 2/1997 | Matsumoto et al. |
| 5,605,854 A | 2/1997 | Yoo |
| 5,633,738 A | 5/1997 | Wakui et al. |
| 5,643,826 A | 7/1997 | Ohtani et al. |
| 5,750,430 A | 5/1998 | Son |
| 5,767,530 A | 6/1998 | Ha |
| 5,767,930 A | 6/1998 | Kobayashi et al. |
| 5,825,437 A | 10/1998 | Seo et al. |
| 5,828,103 A | 10/1998 | Hsu |
| 5,841,170 A | 11/1998 | Adan et al. |
| 5,851,885 A | 12/1998 | Wen |
| 5,917,199 A | 6/1999 | Byun et al. |
| 5,923,961 A | 7/1999 | Shibuya et al. |
| 5,923,962 A | 7/1999 | Ohtani et al. |
| 5,923,999 A | 7/1999 | Balasubramanyam et al. |
| 5,973,378 A | 10/1999 | Ohtani |
| 5,986,305 A | 11/1999 | Wu |
| 6,001,714 A | 12/1999 | Nakajima et al. |
| 6,030,667 A | 2/2000 | Nakagawa et al. |
| 6,031,290 A | 2/2000 | Miyazaki et al. |
| 6,130,106 A | 10/2000 | Zimlich |
| 6,166,414 A | 12/2000 | Miyazaki et al. |
| 6,225,966 B1 | 5/2001 | Ohtani et al. |
| 6,259,138 B1 | 7/2001 | Ohtani et al. |
| 6,271,065 B1 | 8/2001 | Miyamoto et al. |
| 6,323,070 B1 | 11/2001 | Yamazaki |
| 6,335,290 B1 | 1/2002 | Ishida |
| 6,365,917 B1 | 4/2002 | Yamazaki |
| 6,369,410 B1 | 4/2002 | Yamazaki et al. |
| 6,534,789 B2 * | 3/2003 | Ishida ........................ 257/72 |
| 2001/0041392 A1 | 11/2001 | Suzawa et al. |
| 2001/0049197 A1 | 12/2001 | Yamazaki et al. |
| 2001/0052950 A1 | 12/2001 | Yamazaki et al. |
| 2002/0000551 A1 | 1/2002 | Yamazaki et al. |
| 2002/0006705 A1 | 1/2002 | Suzawa et al. |
| 2002/0016028 A1 | 2/2002 | Yamazaki et al. |

* cited by examiner

DEPENDENCY OF W ETCHING RATE ON BIAS POWER

DEPENDENCY OF TaN ETCHING RATE ON BIAS POWER

DEPENDENCY OF SELECTION RATIO OF W AND TaN ON BIAS POWER AND GAS FLOW

DEPENDENCY OF W TAPER ANGLE ON BIAS POWER

Fig. 2A
(CONDITION 7): ICP POWER OF 500W, BIAS POWER OF 150W,
CHAMBER PRESSURE OF 1.0 Pa, $Cl_2$ = 25 sccm,
$CF_4$ = 25 sccm, $O_2$ = 10 sccm
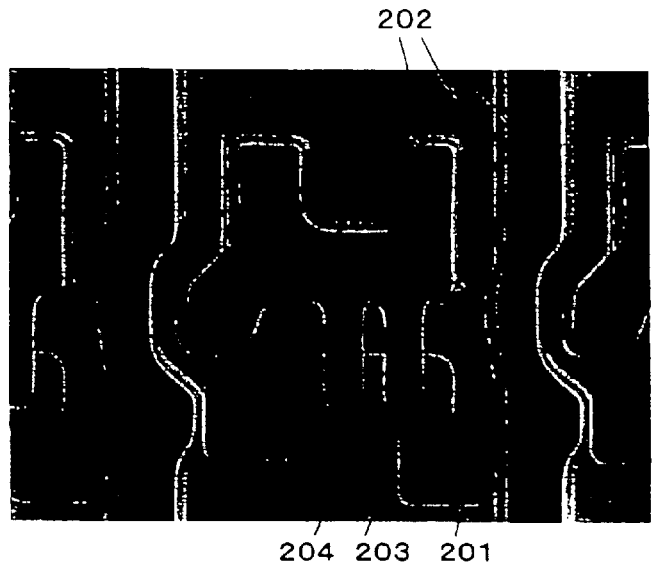
204 203 201
Fig. 2B  AFTER ETCHING TREATMENT UNDER CONDITION 7
(CONDITION 1): ICP POWER OF 500W, BIAS POWER OF 20W,
CHAMBER PRESSURE OF 1.0 Pa,
$Cl_2$ = 30 sccm, $CF_4$ = 30 sccm
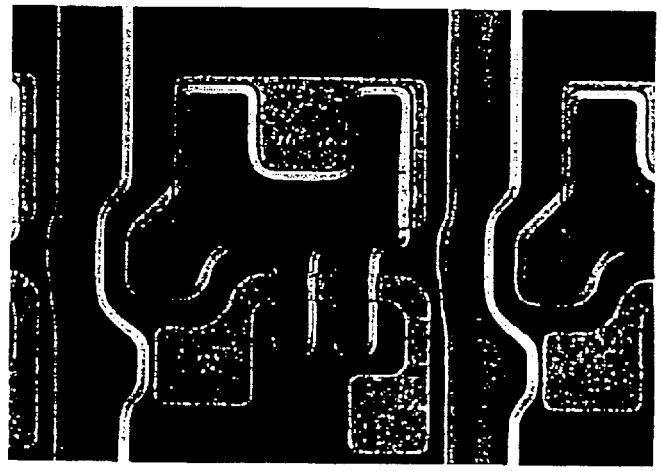

FIRST DRY ETCHING

SECOND DRY ETCHING
DOPING

THIRD DRY ETCHING

FOURTH DRY ETCHING

PEELING OF RESIST
DOPING

VARIATION OF $L_{off}$ LENGTH AND $L_{ov}$ LENGTH BY CHANGE OF ETCHING PERIOD

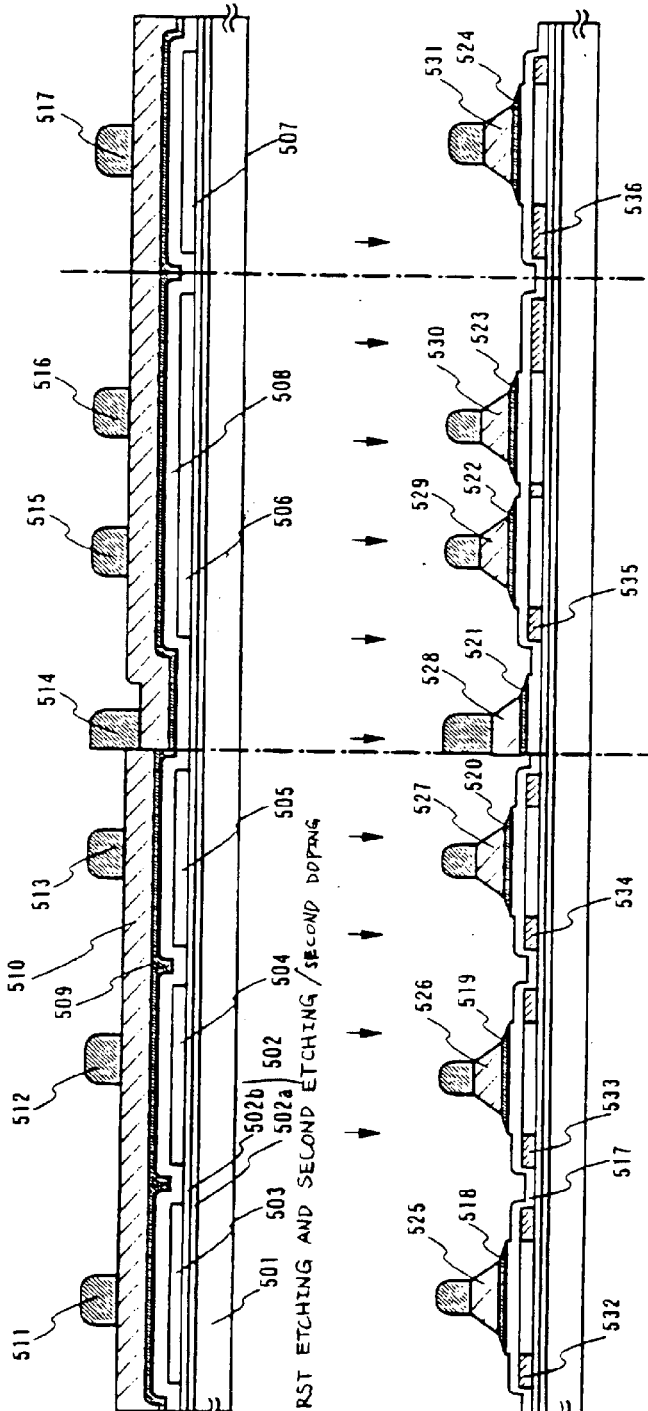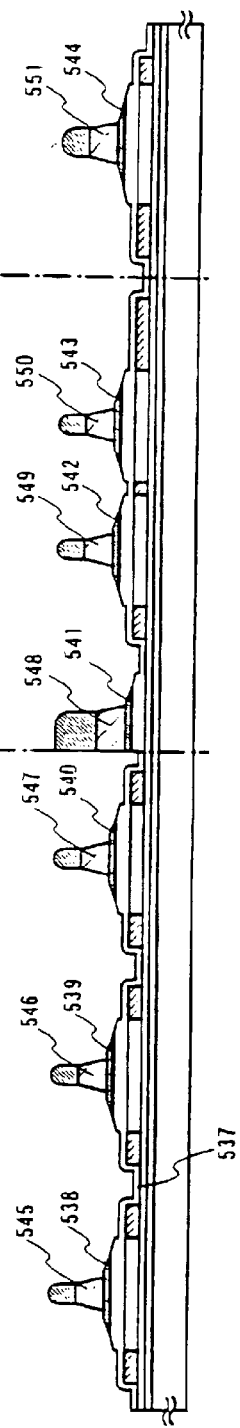

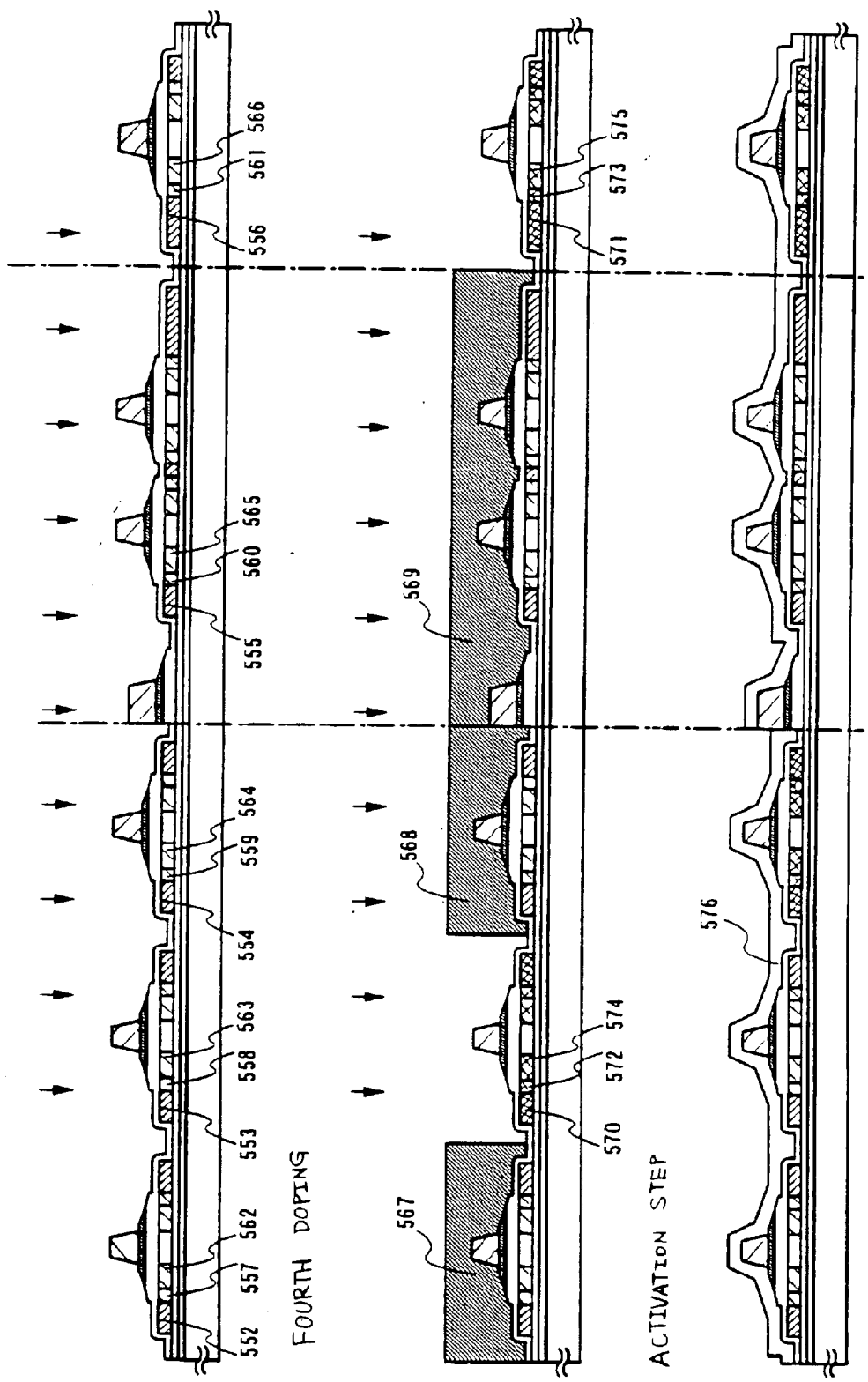

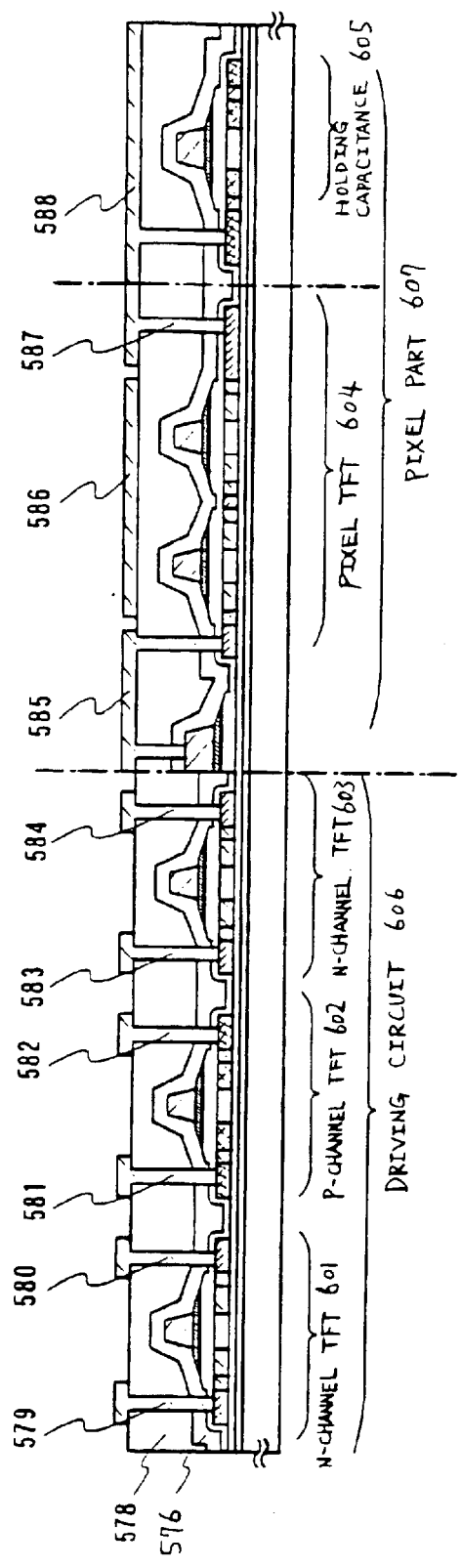

FIRST DRY ETCHING

SECOND DRY ETCHING
DOPING

THIRD DRY ETCHING
DOPING

FOURTH DRY ETCHING

PEELING OF RESIST

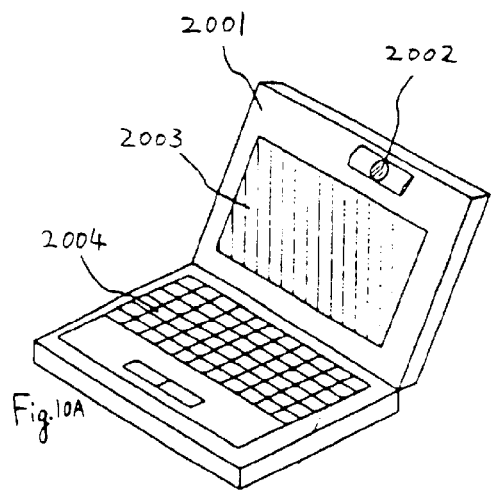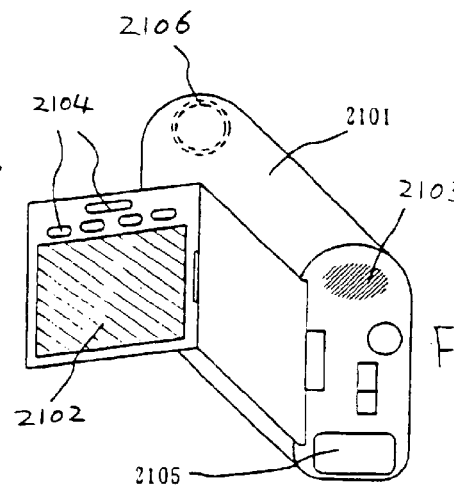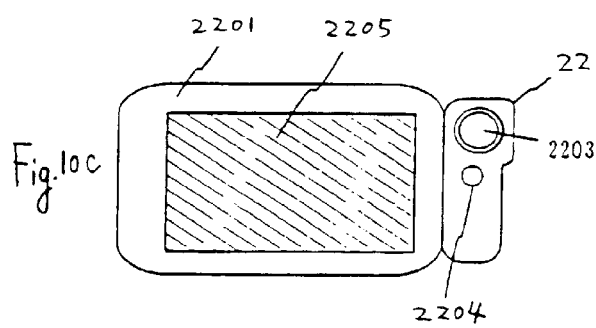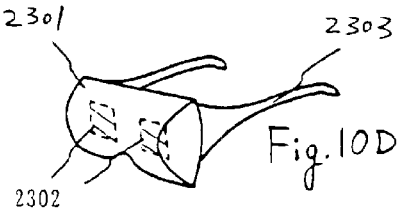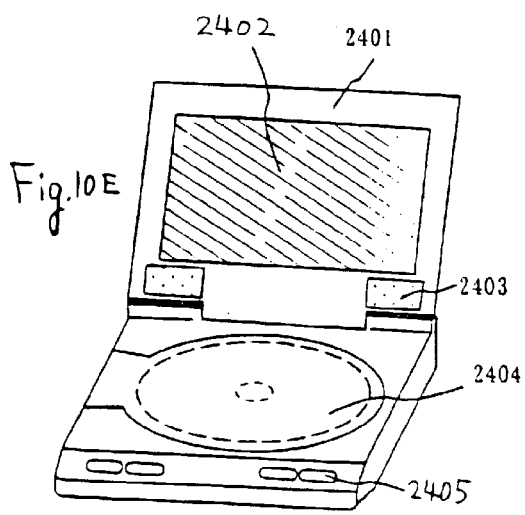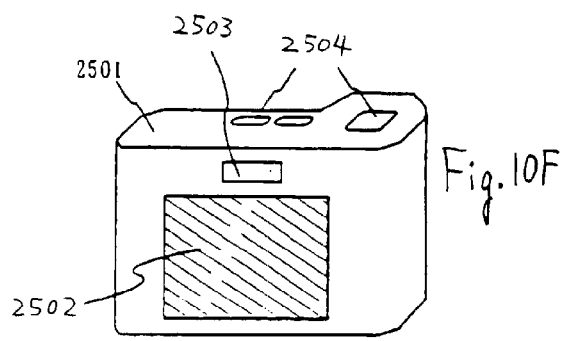

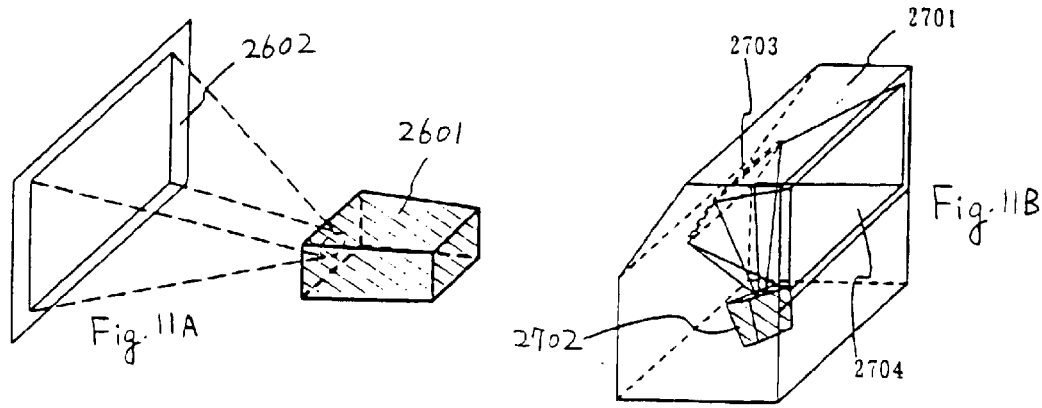
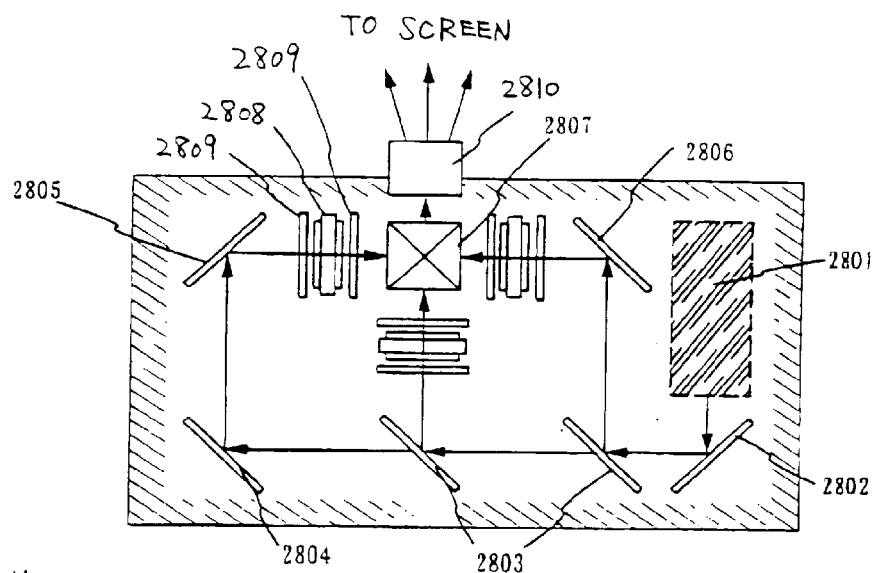
Fig. 11C PROJECTION DEVICE (3-PLATE TYPE)
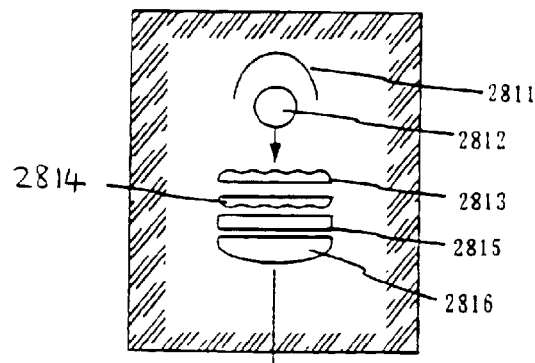
Fig. 11D OPTICAL LIGHT SOURCE SYSTEM

SEMICONDUCTOR DEVICE AND METHOD FOR MANUFACTURING SAME

CROSS-REFERENCE TO RELATED APPLICATIONS

This application is a divisional application of U.S. application Ser. No. 09/852,282, filed on May 10, 2001, now allowed, which claims the benefit from foreign priority applications filed in Japan on May 12, 2000 as Ser. No. 2000-140999 and on Jun. 27, 2000 as Ser. No. 2000-193614. This application claims priority to all of these applications, and all of these applications are incorporated by reference.

BACKGROUND OF THE INVENTION

1. Field of the Invention

This invention relates to a semiconductor device and a method for manufacturing the semiconductor device, and particularly to technology for controlling the formation of impurity-doped regions in a semiconductor layer by a method of working a gate electrode of the device by dry etching. The invention can for example be applied to displays wherein this semiconductor device is used in a display part, and particularly to liquid crystal displays, organic EL displays (a light emitting device or a light emitting diode) and electronic equipment using such displays. The EL (electroluminescent) devices referred to in this specification include triplet-based light emission devices and/or singlet-based light emission devices, for example.

2. Description of the Related Art

When in the fabrication of a semiconductor device a semiconductor layer is formed by dry etching or wet etching, or when an impurity region is formed in a semiconductor layer by doping, a mask made of photoresist is used.

In dry etching or wet etching, the material outside the part covered by the mask is removed, and the material which is not etched assumes the same shape as the shape of the mask. When doping is carried out, an impurity region is formed in the part of the semiconductor layer which is not covered by the mask.

In recent years, the microminiaturization of structures of semiconductor devices having thin film transistors (hereinafter, TFTs) has been progressing. Consequently, there has been a need for finer positioning in mask formation. Insufficiently fine positioning is a cause of formation defects in the forming of resist masks. There has been known a method whereby to overcome this a semiconductor device is fabricated by a part of a TFT (for example the gate electrode) being formed by dry etching and then other parts of the TFT (for example source and drain regions) being formed using this already-formed part of the TFT (for example the gate electrode) as a mask, self-aligningly.

With such a method for making a semiconductor device self-aligningly it is possible to realize a reduction in the number of photo masks used in the forming of photoresist masks by photolithography, and fine positioning is unnecessary. Because of this, the technology is currently receiving attention.

For the forming of an impurity region in a semiconductor layer, the method of doping the semiconductor layer with a group 15 (of the periodic table) impurity element such as phosphorus or arsenic or a group 13 (of the periodic table) impurity element such as boron is used.

Doping a semiconductor layer with a group 15 impurity element forms an n-type region, and doping with a group 13 impurity element forms a p-type region, and in this way source and drain regions are formed in a semiconductor layer.

A characteristic of a TFT is its OFF current (the current which flows through the channel region when the TFT is OFF; in this specification, $I_{off}$). When the characteristics of a TFT are being evaluated, it is desirable that the value of this $I_{off}$ be small.

To make $I_{off}$ small, it is beneficial to form an LDD (Lightly Doped Drain) region in the part of the semiconductor layer positioned outside the gate electrode.

Also, if hot carriers arise in the channel region when the TFT is being driven (i.e. is ON), this causes the semiconductor device to deteriorate. To prevent this, it is desirable that a second LDD region be formed in a part of the semiconductor layer overlapping with the gate electrode.

A semiconductor device structure having an LDD region overlapping with the gate electrode across a gate insulating film is known as a GOLD (Gate-drain Overlapped LDD) structure.

GOLD structures are also called LATID (Large-tilt-angle implanted drain) structures and ITLDD (Inverse TLDD) structures. For example in 'Mutsuko Hatano, Hajime Akimoto and Takeshi Sakai, IEDM97 TECHNICAL DIGEST, P523–526, 1997' it is confirmed that a GOLD structure with a silicon side wall provides extremely good reliability compared to other TFT structures.

In the fabrication of a semiconductor device having a TFT, the forming of a mask from photoresist necessitates many steps beforehand and afterward. These include for example substrate washing; the application of resist material; pre-baking; exposing; developing; and post-baking.

And the photoresist mask must be removed after the etching or doping process, and numerous steps are also required for this removal. These include for example ashing with a gas selected from among $O_2$, $H_2O$ and $CF_4$; removal using chemicals; or removal by means of a combination of ashing and chemical treatment. At this time, removal using chemicals necessitates steps such as chemical treatment; rinsing with pure water; and drying of the substrate.

Thus there has been the problem that using masks made from photoresist increases the number of steps required to make a semiconductor device.

And, along with the microminiaturization of semiconductor devices, finer positioning in mask formation has been required. Insufficiently fine positioning is a cause of formation defects of resist masks, as mentioned above, and time spent repairing such defects results in increased process time and has been a cause of increased manufacturing costs.

The use of masks made from photoresist in the fabrication of semiconductor devices has thus increased the number of steps required for the fabrication process; increased the time required to complete the steps; increased manufacturing costs; and affected product yield.

Accordingly, reducing the number of masks used is an effective way of reducing the manufacturing cost of a semiconductor device.

Also, when the characteristics of a TFT in a semiconductor device are considered, it is desirable that a first LDD region of the kind mentioned above be formed in the semiconductor layer, as this is effective in reducing $I_{off}$ which is an important characteristic of a TFT.

And to prevent deterioration of the semiconductor device it is preferable for the device to have a GOLD structure, and by forming a second LDD region of the kind described above so as to overlap with the gate electrode across the gate insulating film it is possible to suppress hot carriers forming in the channel region and the drain region.

In this specification document the above-mentioned first LDD region will be called the $L_{off}$ region and the above-mentioned second LDD region will be called the $L_{ov}$ region.

However, to dope the $L_{off}$ region and the $L_{ov}$ region with an impurity it has been necessary in each case to form a mask made of photoresist on the semiconductor layer, and the increase in the number of steps resulting from the increase in the number of masks needed has been a problem.

And, in a semiconductor device having a GOLD structure wherein the edge of the gate electrode is positioned on the gate insulating film above the boundary between the $L_{off}$ region and the $L_{ov}$ region, fine positioning is necessary in the formation of the photoresist masks, and the process has been complicated. Consequently, trouble has often arisen which causes positioning failure at the time of mask formation.

For these reasons, in the forming of a semiconductor device having a, GOLD structure, because the structure necessitates fine positioning control, increased numbers of masks and trouble in the formation of photoresist masks have been a great problem and have constituted a cause of increased manufacturing cost of the semiconductor device, increased time required for manufacture, and reduced manufacturing yield.

To overcome this, the present inventors, having been researching the possibility of forming an $L_{off}$ region and an $L_{ov}$ region to constitute LDD regions of a semiconductor device having a GOLD structure self-aligningly without using masks made from photoresist, have invented a fabrication method for forming an $L_{off}$ region and an $L_{ov}$ region by doping a semiconductor layer with an impurity element self-aligningly by means of certain gate electrode materials and dry etching methods.

By using this invention it is possible to form an $L_{off}$ region and an $L_{ov}$ region by doping the semiconductor layer with an impurity element self-aligningly and thereby to reduce the number of masks required and eliminate trouble associated with the formation of these masks. Thus it is possible to reduce the manufacturing cost of a semiconductor device and the time required for its manufacture.

SUMMARY OF THE INVENTION

In the fabrication of a semiconductor device, it is preferable to provide an LDD region. And to suppress deterioration of the semiconductor device, it is desirable to form a GOLD structure. However, to form an LDD region it has hitherto been necessary to form a mask made of photoresist. Consequently, increased mask numbers and increased manufacturing cost have been a problem. However, with the present invention it is possible to form an $L_{off}$ region and an $L_{ov}$ region self-aligningly and thereby to reduce the number of masks needed to manufacture a semiconductor device and to reduce manufacturing time and manufacturing cost.

The edge of a gate electrode in a semiconductor device with a GOLD structure overlaps with part of the LDD region across the gate insulating film. In this invention the shape of the gate electrode is worked to a tapering shape, and doping is carried out self-aligningly a number of times using the gate electrode so worked as a mask. In this way, a source region, a drain region, an $L_{off}$ region and an $L_{ov}$ region are formed. In the doping, by an impurity being doped through part of the gate electrode, the $L_{ov}$ region is formed in a part of the semiconductor layer overlapping with the gate electrode; consequently, impurity regions each having a different impurity concentration are formed in the semiconductor layer.

Specifically, the invention provides a method for forming a semiconductor device with a GOLD structure self-aligningly by means of a semiconductor device fabrication method including: a first step of forming a semiconductor layer; a second step of forming a gate insulating film on the semiconductor layer; a third step of forming a first conducting film on the gate insulating film; a fourth step of forming a second conducting film on the first conducting film; a fifth step of forming a gate electrode of a first shape by carrying out dry etching at least once on the second conducting film and the first conducting film; a sixth step of forming a first impurity region in the semiconductor layer; a seventh step of forming a gate electrode of a second shape by carrying out dry etching on the gate electrode of the first shape; an eighth step of forming a gate electrode of a third shape by carrying out dry etching selectively on the second conducting film of the gate electrode of the second shape; and a ninth step of forming a second impurity region in the semiconductor layer.

In this invention, for each of the first conducting film and the second conducting film a material is selected from among the refractory metals tungsten, tantalum, titanium, and molybdenum; nitrides having at least one of these metals as a main constituent; and alloys containing at least one of these metals. The first conducting film and the second conducting film are made of different materials.

A high-density plasma is used for the dry etching, and an etching apparatus is used with which it is possible to control independently the power of a plasma source and a bias power for generating a negative bias voltage on the substrate side. From experimental results obtained by the inventors it was discovered that the taper angle of the gate electrode edge depends on the bias voltage on the substrate side, and it was found that by setting the bias power of the dry etching apparatus higher it is possible to reduce the taper angle of the gate electrode. By suitably controlling the bias power it is possible to form a gate electrode having at its edge a taper angle of 5 to 80°, and this gate electrode is used as a mask for forming impurity regions.

In this specification document, for convenience, the angle that a sloping side face of a conducting layer makes with the horizontal will be called the taper angle; a sloping side face having this taper angle will be called a tapering shape; and a part having the tapering shape will be called the tapering part.

In the fifth step dry etching is carried out so that a taper angle of 5 to 60° is formed on the edge of the gate electrode, to form a gate electrode of a first shape.

In the seventh step dry etching is carried out with a smaller bias power than in the fifth step. As a result of the bias power being made smaller, the taper angle of the gate electrode edge becomes larger than in the gate electrode of the first shape. Consequently, a gate electrode of a second shape, narrower in width than the gate electrode of the first shape, is formed.

In the eighth step the second conducting film is dry etched selectively. And in this step the taper angle of the edge of the second conducting film of the gate electrode of the second shape becomes larger. However, in the eighth step, because first conducting film of the gate electrode is hardly etched at all, a gate electrode of a third shape wherein the width of the second conducting film is narrower than that of the first conducting film is formed.

For forming the impurity regions, ion doping is used. Besides ion doping, ion injection can alternatively be used. In this invention when doping of the impurity is carried out a mask made from photoresist is not used and instead the gate electrode is used as a mask. Consequently the number of masks needed to make the semiconductor device is reduced. If an n-type semiconductor device is to be made, in the sixth step and the ninth step a group 15 impurity element such as phosphorus or arsenic is doped, whereas if a p-type semiconductor device is to be formed a group 13 impurity element such as boron is doped in the sixth step and the ninth step.

In the sixth step the impurity element is doped through the gate insulating film using the gate electrode of the first shape as a mask, and thereby a first impurity region is formed in the part of the semiconductor layer positioned outside the first shape. This first impurity region is a source or drain region.

In the ninth step a second impurity region is formed by the impurity element being doped using as a mask just the second conducting film of the third shape gate electrode. In the doping conditions in the ninth step a smaller dose and a higher accelerating voltage than in the conditions at the time of the formation of the first impurity region are used, so that a second impurity region having a lower impurity concentration than the first impurity region is formed in the semiconductor layer. And the impurity element is doped into the semiconductor layer through the first conducting film of the gate electrode of the third shape and through the gate insulating film. Of the second impurity region, an $L_{off}$ region is formed outside the gate electrode of the third shape and an $L_{ov}$ region is formed in a region not overlapping with the second conducting film but overlapping with the first conducting film.

By using the above means a GOLD structure semiconductor device is formed which has a semiconductor layer including a source region, a drain region, an LDD region positioned outside the gate electrode and an LDD region overlapping with the gate electrode; a gate insulating film; and a gate electrode. Just two photo masks are needed to form this semiconductor device: a photo mask for forming an island-shaped semiconductor layer; and a photo mask for forming the gate electrode. After the gate electrode is formed using a mask, the source and drain regions and the Loft region and the $L_{ov}$ region are formed in the semiconductor layer self-alignigly.

By reducing the number of masks using the means described above it is possible to reduce the number of manufacturing steps and the time needed to produce the semiconductor device; reduce manufacturing cost; and improve yield.

It is also possible to form a GOLD structure in a semiconductor device having an island-shaped semiconductor layer, a gate insulating film and a gate electrode by processes besides that described above, with the same number of masks, by changing the process order and the conditions of the dry etchings and impurity dopings. Below, a specific manufacturing process constituting an example other than that set forth above is described.

That is, the invention also provides a method for forming a GOLD structure self-alignigly by means of a semiconductor device fabrication method including: a first step of forming a semiconductor layer; a second step of forming a gate insulating film on the semiconductor layer; a third step of forming a first conducting film on the gate insulating film; a fourth step of forming a second conducting film on the first conducting film; a fifth step of forming a gate electrode of a first shape by carrying out dry etching at least once on the second conducting film and the first conducting film; a sixth step of forming a first impurity region in the semiconductor layer; a seventh step of forming a gate electrode of a second shape by carrying out dry etching selectively on the second conducting film of the gate electrode of the first shape, an eighth step of forming a second impurity region in the semiconductor layer; and a ninth step of forming a gate electrode of a third shape by carrying out dry etching selectively on the first conducting film in the gate electrode of the second shape.

In this method, for each of the first conducting film and the second conducting film a material is selected from among the refractory metals tungsten, tantalum, titanium, and molybdenum; nitrides having at least one of these metals as a main constituent; and alloys containing at least one of these metals. The first conducting film and the second conducting film are made of different materials.

For the dry etching, an etching apparatus is used with which it is possible to control independently the power of a plasma source and a bias power for generating a negative bias voltage on the substrate side, or a parallel flat plate type RIE apparatus.

In the fifth step dry etching is carried out so that a taper angle of 5 to 60° is formed on the edge of the gate electrode, to form a gate electrode of a first shape.

In the seventh step the second conducting film in the gate electrode of the first shape is etched selectively. Also, dry etching is carried out with a smaller bias power than in the dry etching of the fifth step. As a result of the bias power being made smaller, the taper angle of the second conducting film edge becomes larger than in the gate electrode of the first shape. And because the first conducting film is hardly etched at all, a gate electrode of a second shape wherein the width of the second conducting film is narrower than that of the first conducting film is formed.

For forming the impurity regions, ion doping is used. Besides ion doping, ion injection can alternatively be used. In the sixth step the gate electrode of the first shape is used as a mask, and a first impurity region is formed in the semiconductor layer positioned outside the first shape by an impurity element being doped through the gate insulating film. This first impurity region becomes a source or drain region.

In the eighth step a second impurity region is formed by doping the semiconductor layer with an impurity element using the second conducting film of the gate electrode of the second shape as a mask. In the doping conditions in the eighth step, a smaller dose and a higher accelerating voltage than in the conditions at the time of the formation of the first impurity region are used, so that a second impurity region having a lower impurity concentration than the first impurity region is formed in the semiconductor layer. And the impurity element is doped into the semiconductor layer through the first conducting film of the gate electrode of the second shape and through the gate insulating film.

In the ninth step, the first conducting film is dry etched selectively. In the first conducting film, because an extremely small taper angle is formed in the part not overlapping with the second conducting film as a result of the seventh step, the first conducting film is etched from its edge and narrows, and a gate electrode of a third shape is formed. At this time, a second impurity region has been formed in the semiconductor layer overlapping with the first conducting film, and as a result of the first conducting film becoming narrow a part of the second impurity region comes to be positioned outside the gate electrode of the third shape. Of this second impurity region, the region positioned outside the gate electrode of the third shape becomes an $L_{off}$ region and the region overlapping with the gate electrode of the third shape becomes an $L_{ov}$ region.

Also by using the means described above, with two photo masks it is possible to form a semiconductor device having a semiconductor layer including a source region, a drain region, an $L_{off}$ region and an $L_{ov}$ region; a gate insulating film; and a gate electrode.

The invention can be said to have a characterizing feature in the method by which the gate electrode is formed.

That is, the invention further provides a method for manufacturing a semiconductor device including a semiconductor layer formed on an insulating surface, an insulating film formed on the semiconductor layer, and a gate electrode formed on the insulating film, the method including: a first step of forming a semiconductor layer on an insulating surface; a second step of forming an insulating film on the semiconductor layer; and a third step of forming on the insulating film a gate electrode made up of a first conducting layer and a second conducting layer having at its edge a taper angle larger than a taper angle at the edge of the first conducting layer.

In this method, the edge of the semiconductor layer is preferably given a tapering shape as shown in FIGS. 3A through 3E and FIGS. 9A through 9E.

And in this method, the edge of the first conducting layer preferably has a tapering shape, and to obtain this tapering shape, in the third step, the gate electrode is formed by carrying out dry etching using a chlorine-based gas and a fluorine-based gas or a chlorine-based gas and a fluorine-based gas and $O_2$ and then carrying out dry etching using a chlorine-based gas and a fluorine-based gas and $O_2$.

Because the second conducting layer has at its edge a larger taper angle (45° to 80°) than the taper angle at the edge of the first conducting layer (below 60° and preferably less than 5°), the second conducting layer is narrower in width than the first conducting layer.

The chlorine-based gas is a gas selected from among $Cl_2$, $BCL_3$, $SiCl_4$ and $CCl_4$. The fluorine-based gas is a gas selected from among $CF_4$, $SF_6$ and $NF_3$.

A semiconductor device having a gate electrode having a tapering shape obtained by this method is also a characterizing feature of the present invention. It is possible to obtain a GOLD structure TFT self-aligningly by forming a gate electrode made up of a first conducting layer and a second conducting layer with differing taper angles and then carrying out doping of an impurity element.

That is, the invention further provides a method for manufacturing a semiconductor device including a semiconductor layer formed on an insulating surface, an insulating film formed on the semiconductor layer, and a gate electrode formed on the insulating film, in which method the gate electrode has a layered structure made up of a first conducting layer constituting a lower layer and a second conducting layer constituting an upper layer and having at its edge a taper angle larger than a taper angle at the edge of the first conducting layer and the semiconductor layer has a channel-forming region overlapping with the second conducting layer across the insulating film, an LDD region overlapping with the first conducting layer across the insulating film, and a source region and a drain region.

In this method, the edge of the semiconductor layer is preferably given a tapering shape as shown in FIGS. 3A through 3E and FIGS. 9A through 9E.

And in this method, as shown in FIGS. 3A through 3E and FIGS. 9A through 9E, the edge of the semiconductor layer is covered by an insulating film provided between the gate electrode and the semiconductor layer. And as shown in FIGS. 3A through 3E and FIGS. 9A through 9E, the insulating film has a tapering shape in the proximity of the gate electrode.

BRIEF DESCRIPTION OF THE DRAWINGS

FIGS. 2A and 2B are photographs of a gate electrode before and after etching;

FIGS. 5A through 5C are views illustrating a process for manufacturing an AM-LCD (Active Matrix Liquid Crystal Display) in accordance with the invention;

FIGS. 6A through 6C are further views illustrating the same process for manufacturing an AM-LCD (Active Matrix Liquid Crystal Display);

FIG. 7 is a further view illustrating the same process for manufacturing an AM-LCD (Active Matrix Liquid Crystal Display);

FIGS. 10A through 10F are views illustrating examples of electronic equipment.

FIGS. 11A through 11D are views illustrating examples of electronic equipment.

DETAILED DESCRIPTION OF THE PREFERRED EMBODIMENTS

First Practicing Mode

Figure 1A:
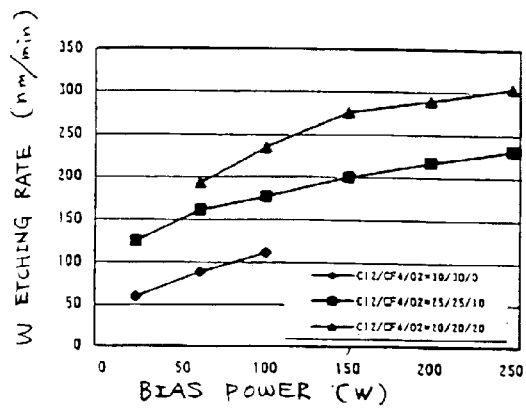
FIGS. 1A through 1D are charts showing etching characteristics of a W film and a TaN film.

The present inventors carried out a number of experiments relating to best modes of practicing the invention. These will now be discussed using FIGS. 1A through 4. The following description will take as an example the case of a gate electrode structure with tantalum nitride as a lower layer and tungsten as an upper layer; however, the invention is not limited to this gate structure, and layers consisting of any elements selected from among tungsten, tantalum, titanium, molybdenum, silver and copper and so on, or nitrides having these elements as constituents, or alloys of these elements may be suitably selected.

In this invention, an apparatus (hereinafter also called an ICP dry etching apparatus) having an ICP (Inductively Coupled Plasma) plasma source was used as the etching apparatus. A characterizing feature of the ICP dry etching apparatus is that,an ICP power, which is the plasma source, and a bias power, which produces a negative bias voltage on the substrate side, can each be controlled independently.

Experiment 1

First, characteristics obtained when this ICP dry etching apparatus was used to etch a tungsten (W) film and a tantalum nitride (TaN) film will be described.

When an ICP dry etching apparatus is used, the important parameters in the etching are the ICP power, the bias power, the etching chamber pressure, the etching gas and the flow of the etching gas. The etching rates of a W film and a TaN film were measured for different combinations of values of these parameters. The results are shown in Table 1 and FIGS. 1A through 1D.

In FIGS. 2A and 2B, an insulating film consisting mainly of silicon is formed on a Corning Corp. #1737 glass substrate, and silicon 201 crystallized by means of heat or a laser is formed on that to a thickness of 55 nm as an island-shaped semiconductor layer. The insulating film is

TABLE 1

(etching rates (E.R.) of W and TaN, and W taper angle)

| condition | ICP [W] | bias [W] | pressure [Pa] | CF$_4$ | Cl$_2$ | O$_2$ [sccm] | W E.R. ① [nm/min] | TaN E.R. ② [nm/min] | W/TaN selection ratio ① ÷ ② | W taper angle [deg] |
|---|---|---|---|---|---|---|---|---|---|---|
| 1 | 500 | 20 | 1.0 | 30 | 30 | 0 | 58.97 | 66.43 | 0.889 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |
| 9 | 500 | 250 | 1.0 | 25 | 25 | 10 | 232.12 | 124.97 | 1.860 | 19 |
| 10 | 500 | 20 | 1.0 | 20 | 20 | 20 | — | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 304.34 | 50.25 | 6.091 | 22 |

It is to be noted that "—" in the above Table 1 means that measurement is impossible because the W surface is changed in quality during the etching.

As the sample structure used for the etching rate measurements, a 400 nm W film or a 300 nm TaN film was formed by sputtering on a Corning Corp. #1737 substrate, and using a photoresist mask of a suitable shape the W film or TaN film was half-etched for a suitable time. The amount of etching of the W film or TaN film was then measured with a step measuring instrument, and the etching rate was calculated from this and the etching time. The results are shown in Table 1 and FIGS. 1A and 1B.

In Table 1, etching rates were evaluated for different bias power and etching gas conditions, with the ICP power fixed at 500 W and the chamber pressure fixed at 1.0 Pa.

Table 1 and FIG. 1A show data on the dependency of the etching rate of the W film on the bias power and the etching gas. It can be seen that the etching rate of the W film increases with increasing bias power and with the addition of oxygen (O$_2$) to the etching gas.

Figure 1B:
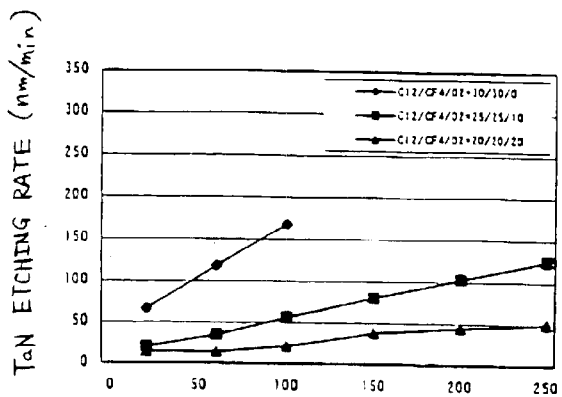

Table 1 and, FIG. 1B show data on the dependency of the etching rate of the TaN film on the bias power and the etching gas. Here it can be seen that although like the etching rate of the W film the etching rate of the TaN film increases with increasing bias power, the etching rate decreases with the addition of oxygen to the etching gas.

Figure 1C:
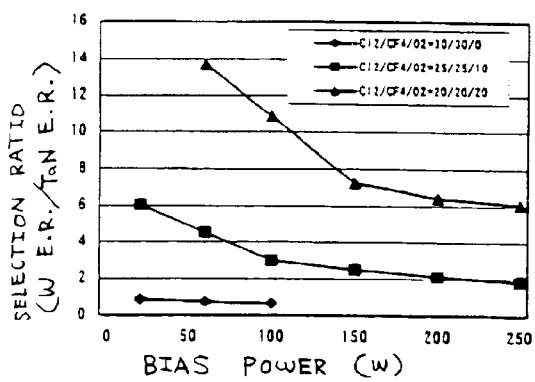

When the data of Table 1 was used to obtain the selectivity of a W film with respect to a TaN film (the ratio of the etching rate of a W film to the etching rate of a TaN film), as shown in Table 1 and FIG. 1C it was found that whereas this selectivity is less than 1 when no oxygen is added to the etching gas, it increases to a maximum of 13.695 when oxygen is added to the etching gas.

Experiment 2

To verify this result, the inventors selected from among the conditions shown in Table 1 and actually carried out etching on a sample with a layered structure made by forming a TaN film on a glass substrate and then forming a W film on the TaN film. The etching conditions and optical microscope photographs of the results are shown in FIGS. 2A and 2B.

formed to prevent the emission of impurities from the glass substrate and may be of any substance and thickness as long as it is insulating.

A gate insulating film is formed so as to cover the island-shaped semiconductor layer on the insulating film.

A TaN film to serve as a first conducting film is formed to a thickness of 30 nm on this gate insulating film, a W film to serve as a second conducting film is formed to a thickness of 370 nm on the first conducting film, and gate electrode and gate interconnection masks 202 are formed with photoresist on this.

FIG. 2A shows the result obtained when the second conducting film was selectively etched using the conditions 7 in Table 1 (wherein the ICP power is 500 W, the bias power is 150 W, and the chamber pressure is 1.0 Pa; Cl$_2$, CF$_4$ and O$_2$ are used for the etching gas; and the flows of the gases Cl$_2$, CF$_4$ and O$_2$ are 25 sccm, 25 sccm and 10 sccm respectively).

FIG. 2B is a photograph of the gate electrode obtained by using the conditions 1 of Table 1 (wherein the ICP power is 500 W, the bias power is 20 W, and the chamber pressure is 1.0 Pa; Cl$_2$ and CF$_4$ are used for the etching gas; and the respective flows of the gases Cl$_2$ and CF$_4$ are each 30 sccm) to etch the W film and the TaN film on the substrate obtained by selectively etching the W film under the conditions 7.

In FIG. 2A, the W film has a tapering shape with a taper angle of 26°; its edge 203 projects outside the resist mask by 700 to 800 nm; and outside that it can be seen that a TaN film 204 remains on the gate insulating film, unetched.

In FIG. 2B, the TaN film and the W film have been etched simultaneously and the TaN film that had remained outside the tapering W film has been completely etched away.

This Experiment 2 was carried out on the basis of selectivities of a W film with respect to a TaN film obtained in Table 1, and confirms that selective etching of a sample actually having a layered structure of a TaN film and a W film is possible. Also, in Experiment 1 and Experiment 2 it was found from the shape of the W film after etching that there is a correlation between the taper angle of the W film and the bias power.

Experiment 3

Next, taper angles obtained on etching W films were measured. An insulating film consisting mainly of silicon was formed on a Corning Corp. #1737 glass substrate, a 400 nm W film was formed on that and then a photoresist 3.5 μm line mask was patterned. At this time, a taper angle of 60° was formed on the edge of the photoresist.

The insulating film is provided to prevent the emission of impurities from the glass substrate during etching of the W film, and as long as there is selectivity of W film with respect to it under the etching conditions used it may be of any type and thickness. The sample was etched under different bias power and etching gas conditions, and using SEM (Scanning Electron Microscopy) its cross-sectional shape was observed and the taper angle measured.

Figure 1D:
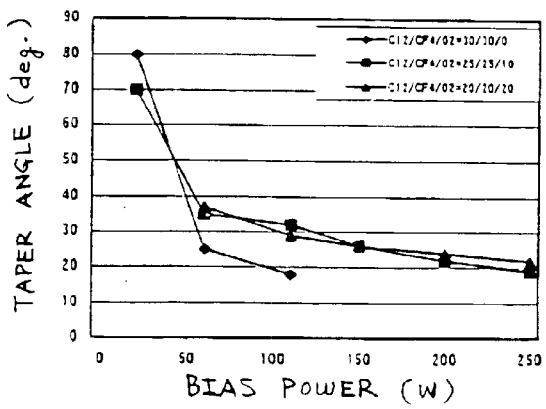

The results are shown in Table 1 and FIG. 1D. As the bias power increases from 50 to 250 Watts the taper angle of the W film gently decreases from 37° to 18°, but when the bias power is 20 W the taper angle is 70° to 80° and thus the shape of the edge of the W film is almost vertical.

The present invention provides a semiconductor device manufacturing method characterized in that a gate electrode has a two-layer structure made up of a gate electrode layer consisting of a first conducting film and formed on this gate electrode layer another gate electrode layer consisting of a second conducting film; the gate electrode layer consisting of the second conducting film is selectively etched through control of an etching gas in dry etching; and a taper angle of the edge of the gate electrode is controlled through control of a bias power producing a negative bias voltage on the substrate side in the dry etching. The shape of the gate electrode is freely worked and the gate electrode is used as a doping mask to dope an impurity into a source region, a drain region and an LDD region having an $L_{off}$ region and an $L_{ov}$ region using self-alignment.

Second Practicing Mode

Next, FIGS. 3A through 3E, which are cross-sectional views showing one end of a gate electrode, will be used to explain in detail a method for using the results of Experiments 1, 2 and 3 described above actually to form a source region, a drain region, an $L_{off}$ region and an $L_{ov}$ region in a semiconductor layer by doping respective regions of the semiconductor layer self-alignly, with the gate electrode as a mask.

First, the following sample is prepared. On a glass substrate 301, an insulating film 302 consisting mainly of silicon is formed to prevent the diffusion of impurities from the glass substrate. Then, an island-shaped semiconductor layer 303 and, covering this, a first shape gate insulating film 304A are formed on the insulating film 302.

A TaN film to serve as a first conducting film is formed to a thickness of 30 nm on this sample, and a W film to serve as a second conducting film is formed to a thickness of 370 nm by sputtering on the first conducting film. Then, a photoresist mask is formed so as to overlap with a region of the island-shaped semiconductor layer to become a channel region.

A first dry etching is then carried out. (FIG. 3A) As the etching conditions, the ICP power is 500 W, the bias power is 150 W, the chamber pressure is 1.0 Pa, and $Cl_2$, $CF_4$ and $O_2$ are used for the etching gas. The respective gas flows of the gases $Cl_2$, $CF_4$ and $O_2$ are 25 sccm, 25 sccm and 10 sccm. These etching conditions are the conditions 7 shown in Table 1, and thus it is possible to form a taper shape of taper angle 26° in the W film and the selectivity of the W film with respect to the TaN film is about 2.5. Here, the W film is dry-etched selectively using these conditions. In the etching, the light emission strength of the plasma is monitored to detect the end point of the etching of the W film.

Preferably, after the end point is detected, over-etching is carried out so that there is no occurrence of etching residues or the like, and here, to prevent the TaN film being etched excessively by a long over-etching, a 10% over-etching is carried out.

As a result of this first dry etching, the W film constituting the second conducting film becomes a first shape gate electrode layer (second conducting layer) 306A having a taper angle of 26°, and the TaN film constituting the first conducting film, although it is etched through 13 to 14 mm in the over-etching, remains over the whole substrate and becomes a first conducting film 305A.

In the first dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

At this time, because the TaN film performs the role of a stopper layer, the first shape gate insulating film 304A is not etched.

Then, without the photoresist being removed, a second dry etching is carried out. As the etching conditions, the ICP power is made 500 W, the bias power is made 20 W, the chamber pressure is made 1.0 Pa, and $Cl_2$ and $CF_4$ are used for the etching gas. The respective flows of the gases $Cl_2$ and $CF_4$ are each 30 sccm. These are the conditions 1 shown in Table 1. The W film and the TaN film are etched at substantially the same etching rate, and become second shape gate electrode layers 305B, 306B.

In the second dry etching, during over-etching of the TaN film, the first shape gate insulating film is etched by 13.8 to 25.8 nm and becomes a second shape gate insulating film 304B.

In the second dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

Figure 3A:
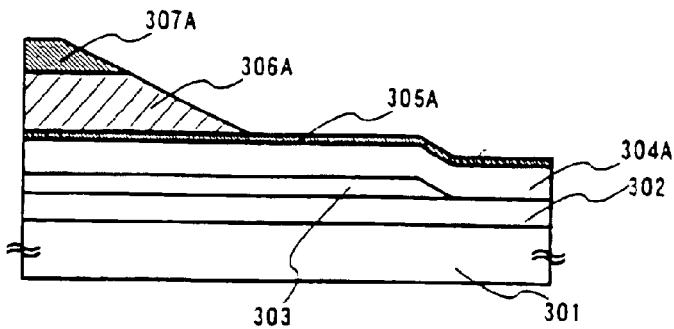
FIGS. 3A through 3E are views illustrating steps of etching and doping a gate electrode in accordance with the invention.
Figure 3B:
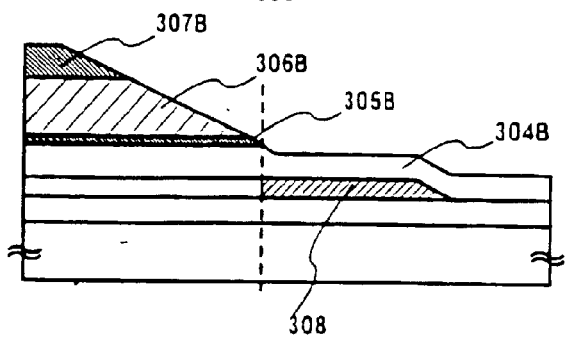
Figure 3C:
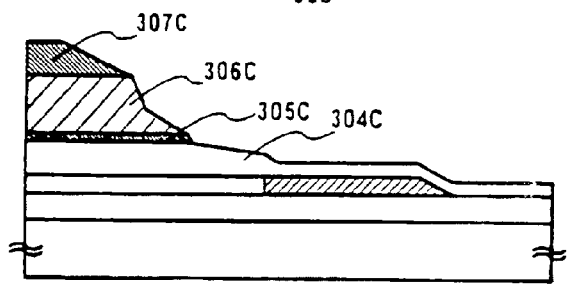

Next, without the photoresist being removed, a first doping is carried out, to form a source region and a drain region in the semiconductor layer 303. Here, to form n-type regions in the semiconductor layer, phosphorus was doped in a dose of $1.5 \times 10^{15}$ atoms/cm$^2$ with an accelerating voltage of 80 kV. An n-type source region and an n-type drain region 308 were thereby formed in the parts of the semiconductor layer doped with phosphorus. (FIG. 3B)

Next, without the photoresist being removed, a third dry etching is carried out. (FIG. 3C) As a result of the second dry etching, the photoresist 307A has become a second shape photoresist 307B. As the etching conditions of the third dry etching, the ICP power is made 500 W, the bias power is made 20 W, and the chamber pressure is made 1.0 Pa. $Cl_2$ and $CF_4$ are used for the etching gas. The respective flows of the gases $Cl_2$ and $CF_4$ are each 30 sccm.

Both the W film and the TaN film are etched in this third dry etching. As a result of the third dry etching, the tapering part of the gate electrode formed by the first and second dry etchings assumes a larger angle and the width of the gate electrode narrows, so that third shape gate electrode layers 305C, 306C are formed.

In this third dry etching, the part of the second shape gate insulating film 304B which does not overlap with the second shape gate electrode layer 305B is slightly etched. And as the second shape gate electrode is etched and narrows in width to become the third shape gate electrode, the gate insulating film progressively exposed to the plasma also is gradually etched, and a third shape gate insulating film 304C having a tapering shape is formed. Here, in the third dry etching, about 60 nm of the gate insulating film is etched.

In the third dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

In the third dry etching it is preferable for $SF_6$ to be used in the gas for etching the W film and the TaN film, because this makes it possible to obtain a high selectivity with respect to the gate insulating film.

When $SF_6$ is used in the gas for the third dry etching, for example the ICP power is made 500 W, the bias power is made 10 W, the chamber pressure is made 1.3 Pa, $Cl_2$ and $SF_6$ are used for the etching gas, and the respective flows of the gases $Cl_2$ and $SF_6$ are made 20 sccm and 40 sccm. At this time the etching rate of the W film is 129.5 nm/min, the etching rate of the gate insulating film is 14.0 nm/m, and the selectivity of the W film with respect to the gate insulating film is 9.61. When the third dry etching is carried out with these conditions, the gate insulating film is only etched by about 5 nm.

An experiment was carried out to evaluate the etching rates of a W film, an $SiO_2$ film and a TaN film using $Cl_2$ and $SF_6$ or $Cl_2$, $SF_6$ and $O_2$ under conditions other than those mentioned above. The results are shown in Table 2.

When $Cl_2$ and $SF_6$ or $Cl_2$, $SF_6$ and $O_2$ are used for the etching gas in the third dry etching, conditions shown in Table 2 may be suitably selected and used.

Next, without the photoresist being removed, a fourth dry etching is carried out. (FIG. 3D) As a result of the third dry etching, the photoresist 307B has changed in shape to a third shape photoresist 307C. As the etching conditions of the fourth dry etching, the ICP power is made 500 W, the bias power is made 20 W, the chamber pressure is made 1.0 Pa, and $Cl_2$, $CF_4$ and $O_2$ are used for the etching gas. The respective flows of the gases $Cl_2$, $CF_4$ and $O_2$ are made 25 sccm, 25 sccm and 10 sccm.

In this fourth dry etching, as a result of the bias power being made 20 W, a still greater taper angle of 70° is formed at the edge of the third shape gate electrode (the W film). And the width of the W film of the gate electrode narrows further to form a fourth shape gate electrode layer 306D. Thus, a fourth shape gate electrode having a gate electrode layer 306D narrower in width than the gate electrode layer 305D is formed by the fourth dry etching.

And, in the fourth dry etching, because the W film of the third shape gate electrode is etched selectively, the end of the TaN film of the fourth shape gate electrode is exposed. Since $O_2$ was added to the etching gas of the fourth dry etching, the etching rate of the TaN film provided as the lower layer of the gate electrode is, from Table 1, 20.67 nm/min, and is slow compared to the W film etching rate of 124.62 nm/min, so that the TaN film undergoes very little etching.

Consequently, after the fourth dry etching, the TaN film constituting the lower layer of the fourth shape gate electrode has the same width as in the third shape gate electrode, and a fourth shape gate electrode layer 305D having a tapering shape at its edge is formed in the fourth dry etching, a gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

TABLE 2

(etching rates (R.E.) and selection ratios of tungsten (W) and a gate insulating film (GI) and tantalum nitride (TaN) under various etching conditions)

| $Cl_2$ | $SF_6$ | $O_2$ | ICP | BIAS | PRESS | W E.R. | GI E.R. | TaN E.R. | selection ratio | |
|---|---|---|---|---|---|---|---|---|---|---|
| [sccm] | | | [W] | [W] | [Pa] | [nm/min] | [nm/min] | [nm/min] | W/SiON | W/TaN |
| 0 | 60 | 0 | 500 | 20 | 1.0 | 94.7 | 26.9 | | 3.78 | |
| 10 | 50 | 0 | 500 | 20 | 1.0 | 90.3 | 28.3 | | 3.43 | |
| 20 | 40 | 0 | 500 | 20 | 1.0 | 113.4 | 31.1 | | 3.87 | |
| 30 | 30 | 0 | 500 | 20 | 1.0 | 105.6 | 37.5 | | 2.98 | |
| 40 | 20 | 0 | 500 | 20 | 1.0 | 94.5 | 37.7 | | 2.67 | |
| 20 | 40 | 0 | 500 | 10 | 1.3 | 129.5 | 14.0 | 85.1 | 9.61 | 1.52 |
| 20 | 40 | 0 | 500 | 20 | 1.3 | 185.1 | 44.3 | 137.5 | 4.45 | 1.35 |
| 20 | 40 | 0 | 500 | 30 | 1.3 | 173.0 | 57.2 | | 3.19 | |
| 20 | 40 | 0 | 700 | 20 | 1.3 | 251.2 | 49.9 | 135.0 | 5.44 | 1.86 |
| 20 | 40 | 0 | 900 | 20 | 1.3 | 358.1 | 65.2 | | 5.81 | |
| 20 | 40 | 0 | 700 | 10 | 1.3 | 274.3 | 29.8 | 107.4 | 9.33 | 2.56 |
| 10 | 50 | 0 | 500 | 20 | 1.3 | 140.6 | 27.6 | 144.1 | 5.43 | 0.98 |
| 10 | 50 | 0 | 500 | 10 | 1.3 | 104.3 | 12.8 | 111.2 | 8.36 | 0.94 |
| 30 | 30 | 0 | 500 | 20 | 1.3 | 153.1 | 48.2 | 116.4 | 3.36 | 1.32 |
| 0 | 60 | 0 | 500 | 20 | 1.3 | | | 146.5 | | |
| 10 | 50 | 0 | 500 | 20 | 1.3 | | | 144.1 | | |
| 20 | 40 | 0 | 500 | 20 | 1.3 | | | 137.5 | | |
| 30 | 30 | 0 | 500 | 20 | 1.3 | | | 116.4 | | |
| 40 | 20 | 0 | 500 | 20 | 1.3 | | | 86.1 | | |
| 50 | 10 | 0 | 500 | 20 | 1.3 | | | 52.3 | | |
| 25 | 25 | 10 | 500 | 20 | 1.0 | 131.1 | 32.7 | | 4.25 | |
| 20 | 20 | 20 | 500 | 20 | 1.0 | 136.9 | 28.0 | | 5.10 | |

In the fourth dry etching, the part of the third shape gate insulating film 304C which does not overlap with the third shape gate electrode layer 305C is slightly etched and a fourth shape gate insulating film 304D is formed.

In the third and fourth dry etchings the part of the gate insulating film which does not overlap with the fourth shape gate electrode layer 305D is etched by 57 to 73 nm, and the gate insulating film is etched by a maximum of 88 nm by the first through fourth dry etchings.

However, in the second, third and fourth etchings, and particularly in the third etching, when $SF_6$ is used in the etching gas, the gate insulating film is only etched by a maximum of 20 nm.

As a result of the first, second, third and fourth dry etchings, a gate electrode and a gate insulating film are formed which have the following characteristics. The gate electrode layer 305D has a longer shape in the channel length direction, that is, a greater width, than the gate electrode layer 306D. The fourth shape gate insulating film 304D is made up of a first gate insulating film region 309, having a first thickness, overlapping with the gate electrode (the TaN film); a second gate insulating film region 310, having a second thickness, outside the gate electrode; a third gate insulating film region 311, changing in thickness from the first thickness to the second thickness between the first gate insulating film region and the second gate insulating film region; and, for convenience, a fourth gate insulating film region 312, denoting the part of first gate insulating film region 309 which overlaps with the fourth shape gate electrode layer 306D. The first gate insulating film region, which includes the fourth gate insulating film region, is the thickest, and the second gate insulating film region is the thinnest.

In the first, second, third and fourth dry etchings, the first and second dry etchings can be carried out consecutively by changing conditions in the same chamber, and the third and fourth dry etchings can also be carried out consecutively by changing conditions in the same chamber.

When the fourth dry etching is finished, the mask 307D, having changed to a fourth shape in the fourth dry etching, is removed. Here, the mask 307D can be removed with an $O_2$ gas plasma using an RIE dry etching apparatus.

Then, using the fourth shape gate electrode as a mask, a second doping is carried out to form in the semiconductor layer 303 self-aligningly an n-channel semiconductor layer to constitute an LDD region. (FIG. 3E) Here also, for convenience, regions in the semiconductor layer 303 will be named, in correspondence with the first through fourth gate insulating film regions named above.

That is, the semiconductor layer region overlapping with the first gate insulating film region will be called the first semiconductor layer region 313; the semiconductor layer region overlapping with the third gate insulating film region will be called the third semiconductor layer region 314; and the semiconductor layer region overlapping with the fourth gate insulating film region will be called the fourth semiconductor layer region 315. Here the fourth semiconductor layer region 315 constitutes a channel region, through which a current flows when the semiconductor device is ON.

However, because the region overlapping with the second gate insulating film region 310 is the source region or the drain region 308, this region will be called the second semiconductor layer region 308.

At this time, it is important that an impurity is doped into the first semiconductor layer region 313 through the gate electrode layer 305D and the first gate insulating film region 309.

Using phosphorus as the dopant, and with doping conditions of dose: $3.5 \times 10^{12}$ atoms/cm$^2$, accelerating voltage: 90 kV, an n-channel LDD region having a lower impurity concentration than the source region or the drain region 308 formed in the first doping is formed in the first semiconductor layer region 313 and the third semiconductor layer region 314.

And in the LDD region, the first semiconductor layer region 313, because it overlaps with the gate electrode layer 305D across the first gate insulating film region 309, becomes an $L_{ov}$ region.

In the second doping the semiconductor layer regions 313 through 315 and 308 become semiconductor layer regions each having a different impurity concentration, and there is the characteristic that the value of the impurity concentration in the source region and the drain region 308 is the highest, the value in the channel region 315 is the lowest, and the value in the $L_{ov}$ region 313 is lower than the value in the $L_{off}$ region 314.

The impurity concentration in the $L_{ov}$ region is lower than in the $L_{off}$ region because the films positioned above the $L_{off}$ region 314 and the $L_{ov}$ region 313 and their film thicknesses are different. When an impurity is doped into semiconductor layer regions through films formed on the semiconductor layer regions, if the thicknesses and/or the materials of the films differ, the amounts of impurity reaching the semiconductor layer regions differ and the impurity concentrations of the semiconductor layer regions will be different.

Above the $L_{off}$ region 314 there is formed the third gate insulating film region 311, which changes in thickness from the above-mentioned first thickness to the above-mentioned second thickness.

Above the $L_{ov}$ region 313, on the other hand, there is formed the first gate insulating film region 309, which has the above-mentioned first thickness, and on the first gate insulating film region 309 there is formed the fourth shape gate electrode layer 305D.

Consequently, when doping of an impurity element is carried out, the amount of the impurity reaching the semiconductor layer is lower in the $L_{ov}$ region than in the $L_{off}$ region, and the resulting impurity concentration of the $L_{ov}$ region is lower than that of the $L_{off}$ region.

In the practicing mode described above, the gate electrode is made up of two layers and the gate electrode is worked freely with it being a characterizing feature of the practicing mode that a 26° to 70° tapering shape is formed on the edge of the gate electrode (W film) and the W film of the gate electrode is etched selectively with respect to the TaN film of the gate electrode. And by doping an island-shaped semiconductor layer with an impurity using the gate electrode as a mask, it is possible to form a source region, a drain region, an $L_{ov}$ region and an $L_{off}$ region in the semiconductor layer self-aligningly, and thereby form an n-channel semiconductor device having a GOLD structure.

In this practicing mode the gate electrode was used as a mask to form an LDD region having and $L_{off}$ region and an $L_{ov}$ region self-aligningly, but when a semiconductor device is actually being made, the lengths of these regions in the channel length direction (hereinafter simply called the LDD length, the $L_{off}$ length and the $L_{ov}$ length) influence the characteristics of the semiconductor device. And the optimum values of the LDD length, the $L_{off}$ length and the $L_{ov}$ length differ according to the purpose for which the semiconductor device is to be used. Therefore, there is a need for the ability to control the values of the LDD length, the $L_{off}$ length and the $L_{ov}$ length in each manufacturing process.

The mechanism by which the LDD region, the $L_{off}$ region and the $L_{ov}$ region are formed will now be explained again using FIGS. 3A through 3E.

From FIG. 3B, the LDD length is the length of the channel length direction component of the portion positioned outside the resist of the tapering part of the second shape gate electrode layers 305B and 306B formed by the second dry etching; the $L_{off}$ length is the length through which the gate electrode layer 305B is etched in the channel length direction in the third dry etching; and the $L_{ov}$ length is the length through which the gate electrode layer 306B alone is etched selectively in the channel length direction in the fourth dry etching.

In other words, the LDD length can be controlled by controlling the taper angle of the gate electrode obtained through the first and second dry etchings; the $L_{off}$ length can be controlled by controlling the amount by which the lower gate electrode layer (the TaN film) is etched, i.e. the etching time, in the third dry etching; and the $L_{ov}$ length can be controlled by controlling the amount by which the upper gate electrode layer (the W film) is etched, i.e. the etching time, in the fourth dry etching.

In this connection, with the taper angle of the gate electrode obtained through the first and second dry etchings made 26°, the $L_{off}$ length and the $L_{ov}$ length were measured for different etching times in the third and fourth dry etchings. The results are shown in Table 3.

TABLE 3

(etching period and Loff length and Lov length)

| sample name | A | B | C |
| --- | --- | --- | --- |
| third etching period [sec] | 40 | 50 | 60 |
| fourth etching period [sec] | 40 | 30 | 20 |
| Loff l-ngth [nm] | 180 | 320 | 480 |
| Lov length [nm] | 780 | 620 | 420 |
| LDD length [nm] | 960 | 940 | 900 |

The total thickness of the gate electrode layer consisting of the first conducting film and the gate electrode layer consisting of the second conducting film here is 400 nm, and the LDD region length is 820 nm; however, in practice this will become about 100 nm longer as a result of etching of the resist mask in the channel length direction in the third and fourth dry etchings.

When the third and fourth etching times were made 80 sec in total and an evaluation of the $L_{off}$ length and the $L_{ov}$ length under three different combinations of the respective etching times was carried out, it was confirmed that when the third etching time is increased and the fourth etching time is reduced the $L_{off}$ length becomes longer and the $L_{ov}$ length becomes shorter. It was found that with the LDD length made a maximum the $L_{off}$ length and the $L_{ov}$ length can be freely controlled by means of the third and fourth dry etchings.

PREFERRED EMBODIMENTS

First Preferred Embodiment

In this preferred embodiment a process for using the technology of the invention to make TFTs having n-channel and p-channel semiconductor layers using five masks and to manufacture a reflecting-type liquid crystal display will be described in detail.

(FIGS. 5A through 5C). In this preferred embodiment, a Corning Corp. #1737 glass substrate 501 of barium boro-silicate glass or alumino-borosilicate glass was used. Alternatively, a quartz substrate, a silicon wafer or a heat-resistant plastic substrate may be used.

A base film 502 is formed on the side of the substrate 501 on which the TFT is to be made. This base film 502 is for preventing the diffusion of impurities from the substrate 501 and may be any insulating film having silicon as a main constituent, such as a silicon oxide film, a silicon nitride film or a silicon oxide nitride film. By plasma CVD or sputtering one or more of these insulating films may be selected and formed in layers as necessary. In this preferred embodiment, the base film was given a two-layer structure.

As a first layer insulating film 502a, a silicon oxide nitride film is formed to a thickness of 10 to 200 nm (preferably 50 to 100 nm) with $SiH_4$, $NH_3$ and $N_2O$ as the reaction gas. In this preferred embodiment the first layer of the base film was made a silicon oxide nitride film 502a (composition Si=32%, O=27%, N=24%, H=17%) and formed to a thickness of 50 nm.

Next, a second layer of base film 502b is formed. A silicon oxide nitride film 502b is formed by plasma CVD to a thickness of 50 to 200 nm (preferably 100 to 150 nm) with $SiH_4$ and $N_2O$ as the reaction gas. In this preferred embodiment, a silicon oxide nitride film 502b of thickness 100 nm (composition Si=32%, O=59%, N=7%, H=2%) was formed.

Then, semiconductor layers 503 through 507 are formed on the base film 502. For the semiconductor layers 503 through 507, noncrystalline films are formed by ordinary means such as plasma CVD or sputtering and then crystallized using a known crystallization method such as laser crystallization or thermal crystallization and patterned to form island-shaped semiconductor layers. The semiconductor layers are formed to a thickness of 25 to 80 nm (preferably 30 to 60 nm). At this time silicon or a silicon-germanium alloy is preferably used as the semiconductor material.

In this preferred embodiment, a noncrystalline silicon film was formed to 55 nm by plasma CVD and then a solution containing nickel was held over the noncrystalline silicon film. This noncrystalline silicon film was dehydrogenated by being heat-treated for 1 hour in an oven heated to 500°, after which the temperature of the oven was raised and crystallization carried out for 4 hours at 550°. To further promote crystallization a linear annealing process was carried out, and a crystalline silicon film was obtained.

In the forming of the noncrystalline silicon film, to prevent contamination by impurities at the interfaces between the first and second layer base films 502a and 502b and the semiconductor layers 503 through 507, preferably the films are formed consecutively in the same chamber as the 502b or in a different chamber by way of an evacuated preparation chamber, without the substrate being exposed to the atmosphere.

The necessary parts of this crystalline silicon film were masked by photolithography and the island-shaped semiconductor layers 503 through 507 were formed by dry etching. For the dry etching, by $CF_4$ or another fluorine gas and $O_2$ being used for the process gas, the crystalline silicon film is etched together with the photoresist so that the edges of the semiconductor layers assume a tapering shape and the coverage in the formation of gate insulating films and insulating films between layers thereafter is good. In this preferred embodiment, the crystalline silicon film was etched using an RIE apparatus with an etching chamber pressure of 13.3 Pa, an RF power of 500 W, and $O_2$=45 sccm, $CF_4$=50 sccm as the process gas, and semiconductor layers 503 through 507 made from the crystalline silicon film having a tapering shape with a taper angle of 22 to 38° at their edges were formed.

For threshold value control of the TFTS, in the semiconductor layers 503 through 507, a small quantity of an impurity element (a group 13 atom such as boron or a group 15 atom such as phosphorus) may be added to the channel regions. In this preferred embodiment, boron was doped into the semiconductor layers 503 through 507 over their entire faces to a dose of $5 \times 10^{13}$ atoms/cm$^2$ and with an accelerating voltage of 30 kV.

A gate insulating film 508 is formed on the substrate so as to cover the semiconductor layers 503 through 507. The gate insulating film 508 is formed to a thickness of 40 to 150 nm using an ordinary method such as plasma CVD or sputtering. As the material of the gate insulating film, an oxide or a nitride consisting mainly of silicon, or an oxide of a metal such as tantalum or aluminum is used. In this preferred embodiment, a silicon nitride film (composition Si=32%, O=59%, N=7%, H=2%) was formed to a thickness of 115 nm by plasma CVD. And in this preferred embodiment, the gate insulating film 508 was formed as a single layer; however, alternatively it may be a structure of two or more layers of film selected from insulating films consisting mainly of silicon or oxide films of metals such as tantalum and aluminum.

And when a silicon oxide film is used, it can be formed by plasma CVD by mixing TEOS (Tetraethyl Orthosilicate) and $O_2$ and effecting electrical discharge at a reaction pressure of 40 Pa, a substrate temperature of 300 to 400°, and a high-frequency (13.5 MHz) power density of 0.5 to 0.8 W/cm$^2$. Good characteristics can be obtained from a silicon oxide film made in this way by thermally annealing it thereafter at 400 to 500° C.

Next, a first conducting film 509 and a second conducting film 510 are formed on the gate insulating film 508. For each of the conducting films a material having low resistivity and having heat-resistance is desirable, and they are formed from an element selected from tungsten, tantalum, titanium, molybdenum, silver, and copper and so on, a nitride containing one of these elements, or an alloy combining two or more of these elements.

The first conducting film 509 and the second conducting film 510, after subsequent steps, function as gate electrodes and gate interconnections. It is a characterizing feature of this invention that the gate electrode has two layers, and here the gate electrode has a lower gate electrode layer consisting of the first conducting film 509 and having a thickness of 20 to 100 nm and an upper gate electrode layer consisting of the second conducting film 510 and having a thickness of 100 to 400 nm.

In this preferred embodiment TaN was chosen for the first conducting film 509, and formed to a thickness of 30 nm by sputtering. The second conducting film 510 is preferably formed with the same apparatus as the apparatus used for forming the first conducting film 509 and is preferably formed consecutively in an apparatus having a plurality of targets in a single film-forming chamber or an apparatus having a plurality of film-forming chambers. This is so as to form the films consecutively in the same apparatus without exposing the substrate to the atmosphere and thereby prevent the occurrence of contamination by impurities of the interface between the first conducting film 509 and the second conducting film 510.

Tungsten (W) was chosen for the second conducting film 510 and formed to a thickness of 370 nm also by sputtering.

A tungsten film can also be formed by plasma CVD. However, for its use as a gate electrode layer, the resistivity of the W film should be kept below 20 $\mu\Omega$cm. In this preferred embodiment, by using a 99.9999% or 99.99% pure tungsten target and also paying ample attention to ensuring that there is no mixing of impurities from the gas phase during film-forming, it was possible to realize a resistivity of 9 to 20 $\mu\Omega$cm.

Next, using a photoresist mask made by photolithography, the first conducting film 509 and the second conducting film 510 are dry etched to form gate electrodes and gate interconnections. Resist masks 511 through 517 are formed on the second conducting film 510.

In this preferred embodiment, a dry etching apparatus having an ICP (Inductively Coupled Plasma) plasma source was used for the dry etching of the gate electrodes. This will be explained here with reference to FIGS. 3A through 3E. FIGS. 5A through 5C and FIGS. 6A through 6C. In FIGS. 3A through 3E, a gate electrode layer 305, a gate electrode layer 306, a gate insulating film 304 and a photoresist 307 after different dry etchings are shown in detail. In the first dry etching step the second conducting film 306A is selectively etched and a gate electrode layer 305A and a gate interconnection layer, and a gate electrode layer 306A and a gate interconnection layer, having first shapes, are formed. In FIGS. 3A through 3E only the gate electrode is shown, and the gate interconnection is not shown.

In this preferred embodiment, as the dry etching conditions, the ICP power was made 500 W, the bias power was made 150 W, the etching chamber pressure was made 1.0 Pa, and $Cl_2$, $CF_4$ and $O_2$ were used for the process gas. The flows of the gases $Cl_2$, $CF_4$ and $O_2$ respectively were 25 sccm, 25 sccm and 10 sccm.

Here, the tungsten, which is the second conducting film, was selectively etched, and a tapering shape having a taper angle of 23° was formed at its edge. The W film of the gate electrode is selectively etched because as a result of the process gas containing $O_2$ the etching rate of the tungsten rises and the etching rate of the TaN film falls, and as a result of the bias power being set to 150 W a gate electrode having a small taper angle is formed.

In the first dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

Because the gate electrode layer 305A is only etched about 13 to 14 nm by the over-etching of the gate electrode layer 306A and remains present over the entire face of the substrate, the gate insulating film positioned underneath the gate electrode layer 305A is not etched and has the shape shown with the reference numeral 304A.

A second dry etching is then carried out. The photoresist mask has now assumed a first shape 307A as a result of the first dry etching. This photoresist 307A is not removed and is used as it is. In the etching the conditions are changed but the process is carried out in the same apparatus and the same chamber.

As a result of the changes to the process gas and the process conditions in the etching the TaN film gate electrode layer and the W film gate electrode layer are etched simultaneously, and a gate electrode layer 305B and a gate electrode layer 306B having a second shape are formed. In this preferred embodiment, the ICP power was made 500 W, the bias power was made 20 W, the etching chamber pressure was made 1.0 Pa, and $Cl_2$ and $CF_4$ were used for the process gas. The flows of the gases $Cl_2$ and $CF_4$ were each 30 sccm.

As a result of the bias power being made smaller than in the first dry etching, the taper angle of the edge of the gate electrode becomes larger and the width of the gate electrode narrows. And because the process gas does not contain $O_2$ the tungsten and the TaN film are etched at the same time, and a gate electrode layer 305B and a gate electrode layer 306B having a second shape are formed. In the second dry etching the gate insulating film 304A is etched about 13.8 to 25.8 nm and becomes a second shape gate insulating film 304B.

In the second dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

The part of the semiconductor layer overlapping with the tapering part of the second shape gate electrode across the gate insulating film becomes an LDD region when a subsequent third doping is carried out. In this preferred embodiment, because the gate insulating film thickness is 400 nm and the taper angle is about 26°, the length of the LDD region is about 820 nm plus the approximately 100 nm by which the resist mask is etched in the channel direction.

As a result of the second dry etching the resist mask assumes a second shape 307B. Without this resist mask 307B being removed, a second doping step is carried out, to form an n-channel semiconductor layer. An impurity element (a group 15 element such as phosphorus or arsenic) imparting the n type is doped into a source region and a drain region with the second shape gate electrode as a mask.

In this preferred embodiment, phosphorus was doped at a dose of $1.5 \times 10^{15}$ atoms/$cm^2$ with an accelerating voltage of 80 kV, whereby source or drain regions 308 of impurity concentration $1 \times 10^{20}$ to $1 \times 10^{21}$ atoms/$cm^3$ were formed. (FIG. 3B)

FIG. 3B corresponds to FIG. 5B: the second shape gate electrode layer 305B corresponds to 518 through 524; and the gate electrode layer 306B corresponds to 525 through 531. However, 521, 524, 528 and 531 are not gate electrode layers. And the source or drain regions 208 through 211 correspond to 532 through 536. However, 536 is a source region and not a drain region.

Next, without the resist mask being removed, a third dry etching step is carried out. In the third dry etching step the second shape gate electrode layer 305B and gate electrode layer 306B are both etched, and also the tapering part whose taper angle was 26° in the second shape assumes a larger angle, and a gate electrode layer 305C and a gate electrode layer 306C of a third shape are formed.

A semiconductor layer region 314 which does not overlap with the third shape gate electrode layer 305C but overlaps with the second shape gate electrode layer 305B becomes an $L_{off}$ region as a result of the subsequent third doping step. The amount by which the gate electrode layer 305C is etched in the channel length direction and the length of the $L_{off}$ region are controlled by way of the third dry etching time.

As the etching apparatus, an ICP dry etching apparatus was again used. As the etching conditions, the ICP power was made 500 W, the bias power was made 20 W, and the etching chamber pressure was made 1.0 Pa. $Cl_2$ and $CF_4$ were used for the process gas. The flows of the gases $Cl_2$ and $CF_4$ were each 30 sccm. The second shape gate electrode layers 305B, 306B were etched, and third shape gate electrode layers 305C, 306C were formed as described above. At this time, the etching time was adjusted so that the amount by which the gate electrode layer 305C was etched in the channel length direction, which essentially becomes the $L_{off}$ length, became 480 nm.

In the third dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

In the third dry etching the part of the gate insulating film which does not overlap with the gate electrode layer 305C is etched to form a third shape gate insulating film 304C.

A fourth dry etching is then carried out. As a result of the third dry etching, the resist mask has a third shape 307C. This resist mask 307C is not removed and is used as it is. The etching conditions are changed and the process is carried out in the same apparatus and the same chamber. In the fourth dry etching, the gate electrode layer 306C is selectively etched again. By conditions such that the gate electrode layer 305C is not etched being used, a shape wherein the gate electrode layer 305C is longer than the gate electrode layer 306C in the channel length direction is obtained.

In the fourth shape gate electrode obtained as a result of the fourth dry etching, a semiconductor layer region 313 which does not overlap with the W film gate electrode layer across the gate insulating film but overlaps with the TaN film gate electrode layer becomes an $L_{ov}$ region in a subsequent doping.

The $L_{ov}$ region is formed to a length obtained by subtracting the $L_{off}$ length determined by the third dry etching from the length of the LDD region.

In this preferred embodiment, the ICP power was made 500 W, the bias power was made 20 W, and the etching chamber pressure was made 1.0 Pa. $Cl_2$, $CF_4$ and $O_2$ were used for the process gas. The flows of the gases $Cl_2$, $CF_4$ and $O_2$ were 25 sccm, 25 sccm and 10 sccm respectively. The third shape W film gate electrode layer was selectively etched, and by the taper angle of the edge thereof being further increased a gate electrode layer 306D having a fourth shape, narrower in width than the third shape gate electrode layer 306C, was formed.

The TaN film gate electrode layer is only etched about 7 nm, and a fourth shape gate electrode layer 305D of substantially the same width as the third shape gate electrode layer 305C is formed.

The fourth shape gate electrode layer 305D becomes longer by 420 nm on either side of the gate electrode than the gate electrode layer 306D (840 nm over the gate width as a whole), and in this preferred embodiment a $L_{ov}$ region 313 of length 420 nm was obtained.

In the fourth dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

Figure 3D:
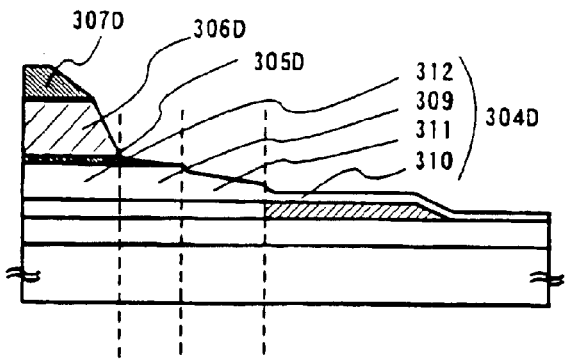

FIG. 3D corresponds to FIG. 5C: the fourth shape gate electrode layer 305D corresponds to 538 through 544; and the gate electrode layer 306D corresponds to 545 through 551. However, 541, 544, 548 and 551 are not gate electrode layers.

After the fourth dry etching is finished, the photoresist mask 307D is removed. The mask may be removed by $O_2$ ashing, $H_2O$ ashing, ashing with a gas mixture of $O_2$ and $H_2O$, ashing with one of these gases with nitrogen or a fluorine gas such as $CF_4$ added, or by some other known method such as removal with a chemical. In this preferred embodiment, the mask 307D was removed by $O_2$ ashing using an RIE dry etching apparatus.

Next, a third doping is carried out to form an LDD region. (FIG. 3E) Using the fourth shape gate electrode layer 306D an n-type region having a lower impurity density than the source and drain regions is formed in the first semiconductor layer region 313 and the third semiconductor layer region 314. Because in the semiconductor layer region 313 the impurity is doped into the $L_{ov}$ region through the gate electrode layer 305D and the gate insulating film 309, the doping is carried out at a low density and a high accelerating voltage.

In this preferred embodiment, an $L_{off}$ region 314 and an $L_{ov}$ region 313 were formed with a dose of $3.5 \times 10^{12}$ atoms/cm$^2$ and an accelerating voltage of 90 kV.

Although in this preferred embodiment the resist mask 307D was removed after the fourth gate electrode etching, it may alternatively be removed after the third doping.

Figure 3E:
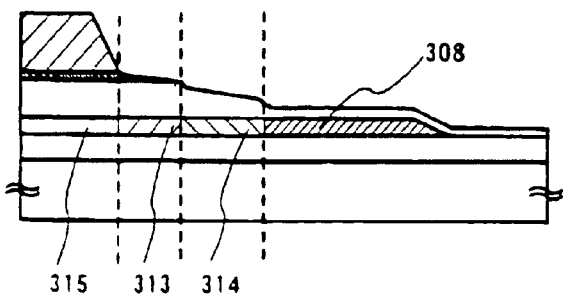
Figure 4:
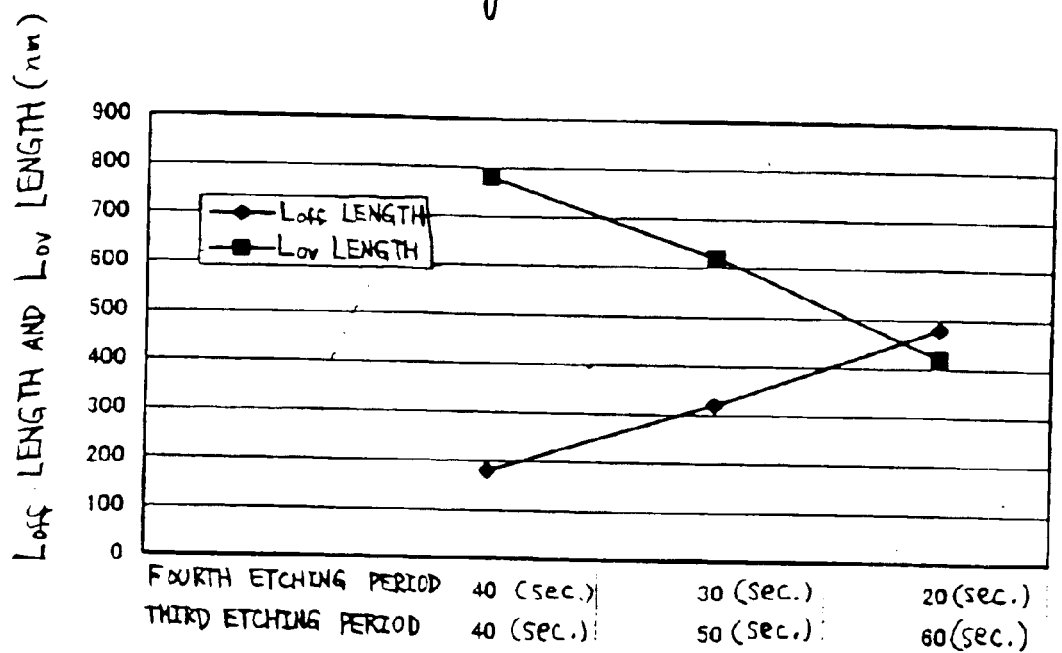
FIG. 4 is a graph showing variation of the length of an LDD region with etching conditions.

FIG. 3E corresponds to FIG. 6A: the $L_{off}$ region 314 corresponds to 557 through 561; and the $L_{ov}$ region 313 corresponds to 562 through 566. However, 556, 561 and 566 do not function as $L_{ov}$ or $L_{off}$ regions.

Then, a photoresist mask 567 is newly formed and a p-type semiconductor layer is formed by a fourth doping step. (FIG. 6B) By doping with an impurity imparting the p type, p-type semiconductor layer regions 570 through 575 are formed.

At this time, an impurity imparting the n type has been added to the semiconductor layer regions 570 through 575, but by doping the impurity imparting the p type to a concentration of $2 \times 10^{20}$ to $2 \times 10^2$ atoms/cm$^3$ a p-type semiconductor layer function can be obtained without problems.

In this preferred embodiment, boron was used with a dose of $3 \times 10^{15}$ atoms/cm$^2$ and an accelerating voltage of 20 to 30 kV, whereby p-type semiconductor layer regions 570 through 575 were formed.

After the photoresist mask 567 is removed, a first inter-layer insulating film 576 is formed over the entire face of the substrate. In this step a 150 nm film of silicon oxide nitride was formed by plasma CVD, but of course some other method such as sputtering may alternatively be used, and the film is not limited to silicon oxide nitride and may be some other insulating film consisting mainly of silicon. And in an insulating film consisting mainly of silicon it may be single-layer or a layered film of two or more types.

Next, a step of activating the impurity element added to the semiconductor layer is carried out. This activation step is carried out by thermal annealing using a furnace annealing oven. The annealing may be carried out in a nitrogen atmosphere with an oxygen concentration of 1 ppm or below and preferably 0.1 ppm or below at 400 to 700° C. and typically 500 to 550° C., and in this preferred embodiment the activation was carried out with a heat-treatment of 550° C., 4 hours. Besides thermal annealing, laser annealing or rapid thermal annealing (RTA) can alternatively be applied.

This activation step may be carried out before the first inter-layer insulating film 576 is formed (FIG. 6C); however, here, because heat is applied in the activation step, when the material used for the gate electrode and so on is vulnerable to heat, preferably a silicon oxide film, a silicon nitride film or a silicon oxide nitride film is formed as a protective film, or as in this preferred embodiment the first inter-layer film is made to function as a protective film.

After that, a heat-treatment of 1 to 12 hours at 300 to 550° C. in a 3 to 100% hydrogen atmosphere is carried out, and a step of hydrogenating the semiconductor layer is performed.

In this preferred embodiment, a hydrogenation of 1 hour in a 100% $H_2$, 350° C. atmosphere was carried out. This hydrogenation may alternatively be conducted in a hydrogen plasma atmosphere.

Next, a second inter-layer insulating film 578 consisting of an organic resin film such as acrylic or polyamide which can be formed by spin coating is formed on the first inter-layer insulating film 576 (FIG. 7). The second inter-layer insulating film is formed by spin coating with the object also of flattening the substrate on which the semiconductor device is formed.

In this preferred embodiment, acrylic was formed to a film thickness of 1600 nm.

After that, the gate insulating film 537, the first inter-layer insulating film 576 and the second inter-layer insulating film 578 positioned on the source and drain regions and the gate interconnection are etched to form contact holes for connecting with intermediate interconnections 579 through 588. As the etching method of the insulating films at this time, etching matched to the different films should be carried out so that to make the coverage in the forming of the intermediate interconnections good a tapering shape of taper angle 45 to 80° is obtained, and for example etching of the organic resin film such as acrylic or polyamide and the silicon oxide nitride film used for the first inter-layer insulating film 576 is possible with a gas mixture of $CF_4$ and $O_2$. However, to etch the gate insulating film formed on the semiconductor layer it is necessary to use conditions which provide a high selectivity with respect to the semiconductor layer. Gases suitable for selectively etching the silicon oxide nitride of the gate insulating film with respect to the semiconductor layer silicon include $CHF_3$ and $C_4F_8$ and the like. $CHF_3$ and $C_4F_8$ can also be called fluorine gases; however, they are gases having a high selectivity with respect to silicon, and because their use is different from the other fluorine gases referred to in this specification document they are taken in this document not to be included among fluorine gases.

In this preferred embodiment, with an RIE apparatus and using $CF_4$, He and $O_2$ gas, a chamber pressure of 66.7 Pa, an RF power of 500 W and $CF_4$, He and $O_2$ gas flows of 5 sccm, 40 sccm and 95 sccm respectively, the second inter-layer insulating film 578 was etched; with the same RIE apparatus and using $CF_4$, He and $O_2$ gas, a chamber pressure of 40.0 Pa, an RF power of 300 W and $CF_4$, He and $O_2$ gas flows of 50 sccm, 35 sccm and 50 sccm respectively, the silicon oxide nitride of the first inter-layer insulating film 576 was etched; and with the same RIE apparatus and using $CHF_3$, a chamber pressure of 7.3 Pa, an RF power of 800 W and a $CHF_3$ gas flow of 35 sccm, the silicon oxide nitride of the gate insulating film was etched selectively-with respect to the semiconductor layer.

Then, intermediate interconnections 579 through 588 are formed. For the intermediate interconnections, so that they function as pixel electrodes and reflecting electrodes, preferably a metal material having a high reflectivity is used, and in this preferred embodiment Ti and an alloy of Al and Ti were formed in layers. Using sputtering, a Ti film was formed to a thickness of 50 nm, and then an alloy film of Al and Ti was formed to a thickness of 500 nm immediately thereafter.

After a mask is formed with photoresist, the intermediate interconnections are dry etched using chlorine or a gas containing chlorine. In this preferred embodiment, the intermediate interconnections 579 through 588 were formed by carrying out dry etching using a gas made by mixing chlorine and boron trichloride in the same proportions.

In the way described above, it is possible to form on the same substrate a driving circuit 606 having an n-channel TFT 601, a p-channel TFT 602 and an n-channel TFT 603, and a pixel part 607 having a pixel TFT 604 and a holding capacitance 605. In this specification this substrate will for convenience be called an active matrix substrate.

Next, with reference to FIG. 8, a method for manufacturing a reflective active matrix type liquid crystal display using the active matrix substrate shown in FIG. 7 will be described.

First, a spacer 589 obtained by patterning a resin film on the active matrix is formed. The disposition of the spacer may be determined freely. A spacer may alternatively be provided by scattering particles of a few μm in size.

Next, an orienting film 590 made of polyamide resin or the like for orienting liquid crystal in the pixel part of the active matrix substrate is provided. After the orienting film was formed, a rubbing treatment was carried out to orient the liquid crystal molecules with a fixed prechilt angle.

Then, a facing substrate 591 is prepared. On the facing substrate are formed a light-blocking film 592, a transparent electrode 593 and an orienting film 594. The light-blocking film 592 is made by forming a Ti film, a Cr film or an Al film or the like to a thickness of 150 to 300 nm.

A rubbing treatment is carried out on the orienting film 594. Then, the active matrix substrate on which the pixel part and the driving circuit are formed and the facing substrate are fixed together face-to-face with a sealant 595.

After that, a liquid crystal material 596 is poured between the two substrates. For the liquid crystal material, an ordinary liquid crystal material may be used. For example besides TN liquid crystal a thresholdless anti-dielectric mixed liquid crystal showing an electro-optical responsiveness such that its transmittivity changes continuously with the magnetic field can be used. Such thresholdless anti-dielectric mixed liquid crystals also include those showing V-type electro-optical responsiveness. After the liquid crystal material 596 is poured, the device is sealed completely with a sealing agent.

Figure 8:
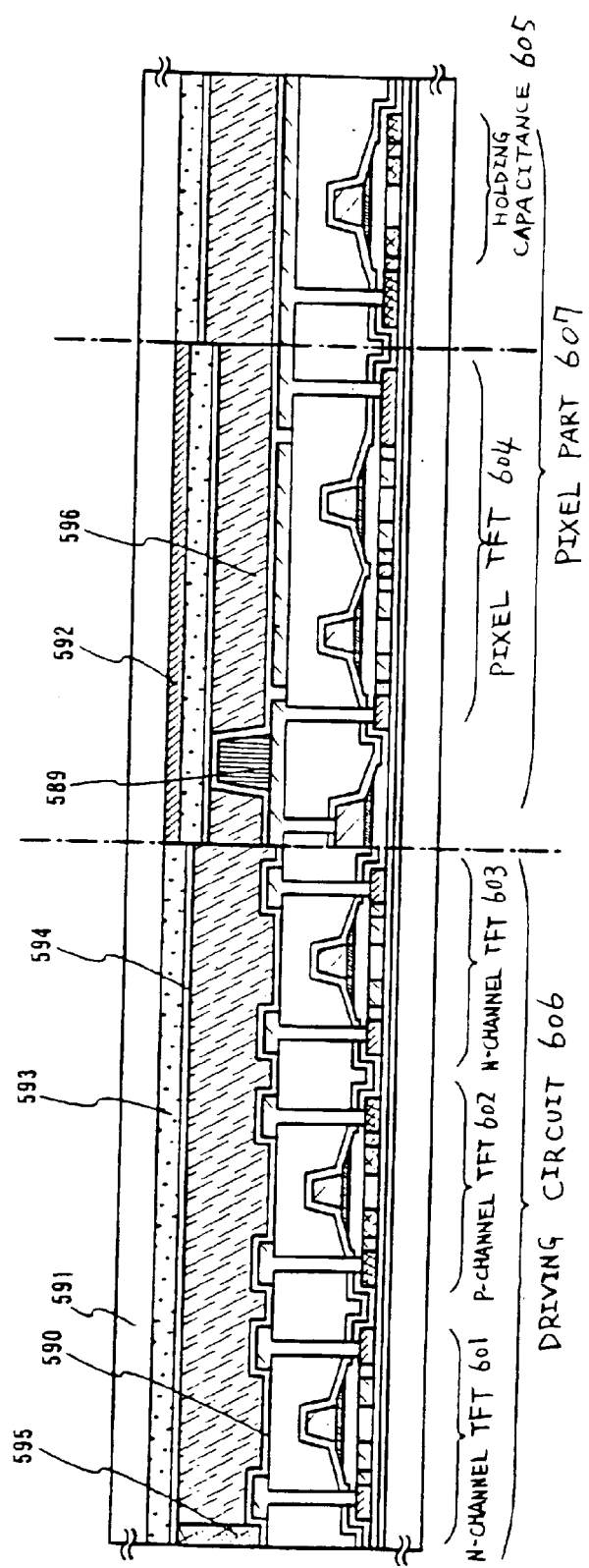
FIG. 8 is a sectional construction view of a reflective liquid crystal display.
Figure 9A:
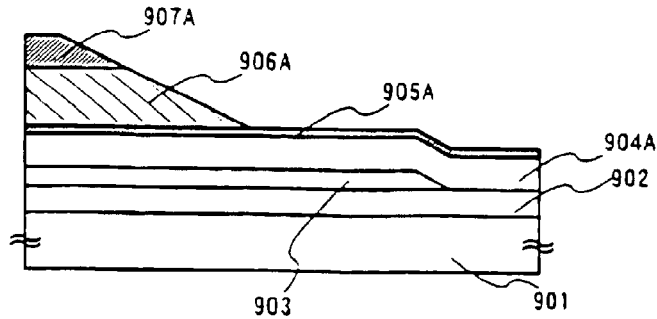
FIGS. 9A through 9E views illustrating steps of etching and doping a gate electrode in accordance with the invention.
Figure 9B:
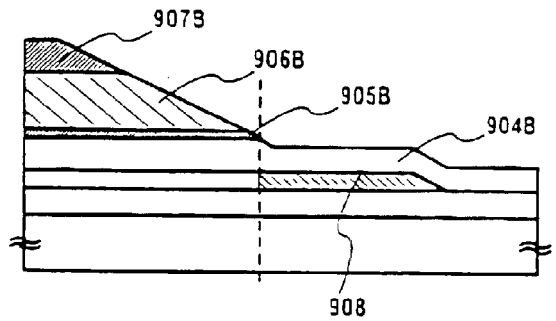
Figure 9C:
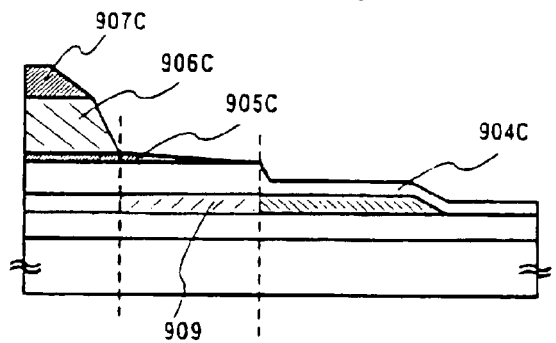
Figure 9D:
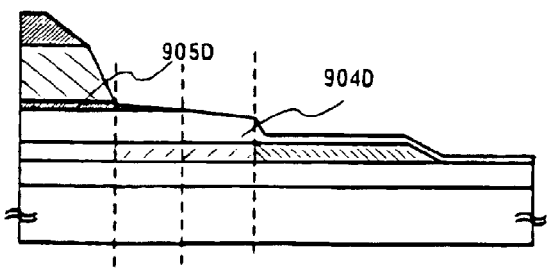
Figure 9E:
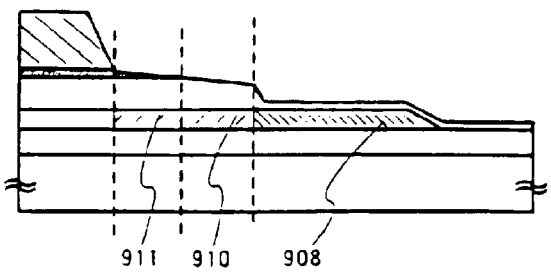

In this way the reflective active matrix liquid crystal display shown in FIG. 8 is completed.

Second Preferred Embodiment

In this preferred embodiment, a method is explained wherein $SF_6$ is used in the etching gas when forming the gate electrode by dry etching in the first preferred embodiment, to obtain a higher selectivity with respect to the gate insulating film. In this preferred embodiment the steps up to the forming of the gate electrode and from the third doping onward after the formation of the gate electrode are exactly the same as in the first preferred embodiment and therefore will not be described again here.

A first conducting film 305 and a second conducting film 306 formed in accordance with the first preferred embodiment are dry etched using a resist mask 307 made by photolithography. As in the first preferred embodiment, a TaN film was used for the first conducting film and a W film was used for the second conducting film.

In this preferred embodiment, a dry etching apparatus having an ICP (Inductively Coupled Plasma) plasma source was used for the dry etching of the gate electrode.

The ICP power in the first dry etching was made 500 W, the bias power was made 150 W, the etching chamber pressure was made 1.0 Pa, and $Cl_2$, $CF_4$ and $O_2$ were used for the process gas. The flows of the gases $Cl_2$, $CF_4$ and $O_2$ were made 25 sccm, 25 sccm and 10 sccm respectively.

The tungsten of the second conducting film was selectively etched, and a tapering shape having a taper angle of 23° was formed at its edge. The W film of the gate electrode is selectively etched because as a result of the process gas containing $O_2$ the etching rate of the tungsten rises and the etching rate of the TaN film falls. And as a result of the bias power being set to 150 W, a gate electrode having a small taper angle is formed.

Because the gate electrode layer 305A is only etched about 13 to 14 nm by the over-etching of the W film gate electrode layer and remains present over the entire face of the substrate, the gate insulating film positioned underneath the gate electrode layer 305A is not etched and has the shape shown with the reference numeral 304A.

In the first dry etching $Cl_2$, $SF_6$ and $O_2$ may alternatively be used for the etching gas.

A second dry etching is then carried out. The photoresist mask has now assumed a first shape 307A as a result of the first dry etching. This photoresist 307A is not removed and is used as it is. In the etching the conditions are changed but the process can be carried out in the same apparatus and the same chamber.

As a result of the changes to the process gas and the process conditions in the dry etching, the TaN film gate electrode layer and the W film gate electrode layer are etched simultaneously, and a gate electrode layer 305B and a gate electrode layer 306B having a second shape are formed. In this preferred embodiment, the ICP power was made 500 W; the bias power was made 10 W; the etching chamber pressure was made 1.3 Pa; and $Cl_2$ and $SF_6$ were used for the process gas. The flows of the gases $Cl_2$ and $SF_6$ were made 10 sccm and 50 sccm respectively.

As a result of the bias power being made smaller than in the first dry etching, the taper angle of the gate electrode edge increases and the width of the gate narrows. The etching rate of the W film at this time is 104 nm/min and the etching rate of the TaN film is 111 nm/min, so the two films are etched at almost the same rate. A gate electrode layer 305B and a gate electrode layer 306B having a second shape are formed.

At this time, the TaN film that had remained after the first dry etching is etched for about 8 seconds. After that, to completely remove etching residues of the TaN film, an over-etching of 15 seconds is carried out. By this over-etching, the gate insulating film positioned underneath the TaN film is etched by about 3.2 nm and becomes a second shape gate insulating film 304B.

The part of the semiconductor layer overlapping with the tapering part of the second shape gate electrode across the gate insulating film becomes an LDD region when a subsequent third doping is carried out. In this preferred embodiment, because the gate insulating film thickness is 400 nm and the taper angle is about 26°, the length of the LDD region is about 820 nm plus the approximately 100 nm by which the resist mask is etched in the channel direction.

As a result of the second dry etching the resist mask assumes a second shape 307B. Without this resist mask 307B being removed, a second doping step is carried out, to form an n-channel semiconductor layer. An impurity element (a group 15 element such as phosphorus or arsenic) imparting the n type is doped into a source region and a drain region with the second shape gate electrode as a mask.

In this preferred embodiment, phosphorus was doped at a dose of $1.5 \times 10^{15}$ atoms/cm$^2$ with an accelerating voltage of 80 kV, whereby source or drain regions 308 of impurity concentration $1 \times 10^{20}$ to $1 \times 10^{21}$ atoms/cm$^3$ were formed, in a source region or drain region in a self-adjustment way.

Next, without the resist mask being removed, a third dry etching step is carried out. In the third dry etching step the second shape gate electrode layer 305B and gate electrode layer 306B are both etched, and etching is carried out so that also the tapering part whose taper angle was 26° in the second shape assumes a larger angle, and a gate electrode layer 305C and a gate electrode layer 306C of a third shape are formed.

A semiconductor layer region 314 which does not overlap with the third shape gate electrode layer 305C but overlaps with the second shape gate electrode layer 305B becomes an $L_{off}$ region as a result of the subsequent third doping step. The amount by which the gate electrode layer 305C is etched in the channel length direction and the length of the $L_{off}$ region are controlled by way of the third dry etching time.

As the etching apparatus, an ICP dry etching apparatus was again used. As the etching conditions, the ICP power was made 500 W, the bias power was made 10 W, and the etching chamber pressure was made 1.3 Pa. $Cl_2$ and $SF_6$ were used for the process gas. The flows of the gases $Cl_2$ and $SF_6$ were made 10 sccm and 50 sccm respectively. The TaN film gate electrode layer and the W film gate electrode layer were etched, and a gate electrode layer 305C and a gate electrode layer 306C having third shapes were formed as described above. At this time, the etching time was made 40 seconds so that the amount by which the TaN film gate electrode layer was etched in the channel length direction, which essentially becomes the $L_{off}$ length, became 480 nm.

In the third dry etching the part of the gate insulating film which does not overlap with the gate electrode layer 305C is etched by about 5.8 nm and becomes a third shape 304C. In the steps up to here the gate insulating film has been etched by about 9.0 nm.

A fourth dry etching is then carried out. As a result of the third dry etching, the resist mask has a third shape 307C. This resist mask 307C is not removed and is used as it is. The etching conditions are changed and the process is carried out in the same apparatus and the same chamber. In the fourth dry etching, the gate electrode layer 306C is selectively etched again. By conditions such that the TaN film gate electrode layer is not etched being used, a shape wherein the TaN film gate electrode layer is longer than the W film gate electrode layer in the channel length direction is obtained.

In the fourth shape gate electrode obtained as a result of the fourth dry etching, a semiconductor layer region 313 which does not overlap with the W film gate electrode layer across the gate insulating film but overlaps with the TaN film gate electrode layer becomes an $L_{ov}$ region in a subsequent third doping.

The $L_{ov}$ region is formed to a length obtained by subtracting the $L_{off}$ length determined by the third dry etching from the length of the LDD region.

In this preferred embodiment, the ICP power was made 500 W, the bias power was made 20 W, and the etching chamber pressure was made 1.0 Pa. $Cl_2$, $SF_6$ and $O_2$ were used for the process gas. The flows of the gases $Cl_2$, $SF_6$ and $O_2$ were each 20 sccm. The third shape W film gate electrode layer was selectively etched, and by the taper angle of the edge thereof being further increased a gate electrode layer 306D having a fourth shape, narrower in width than the third shape gate electrode layer 306C, was formed.

The TaN film gate electrode layer is only etched by a few nm, and a fourth shape gate electrode layer 305D of substantially the same width as the third shape gate electrode layer 305C is formed.

The fourth shape gate electrode layer 305D becomes longer by 420 nm on either side of the gate electrode than the gate electrode layer 306D (840 nm over the gate width as a whole), and in this preferred embodiment a $L_{ov}$ region 313 of length 420 nm was obtained.

In the fourth dry etching the gate insulating film is etched by about 0.5 nm. And the amount by which the gate insulating film is etched in the first, second, third and fourth etchings is 9.5 nm. Whereas in the first preferred embodiment the amount by which the gate insulating film was etched in the first, second, third and fourth etchings was a maximum of 88 nm, in this preferred embodiment, because $SF_6$ was used in the etching gas, the selectivity with respect to the gate insulating film was higher and it was possible to reduce the amount of etching of the gate insulating film by about 89%.

After the fourth dry etching is finished, the photoresist mask 307D is removed. The mask may be removed by $O_2$ ashing, $H_2O$ ashing, ashing with a gas mixture of $O_2$ and $H_2O$, ashing with one of these gases with nitrogen or a fluorine gas such as $CF_4$ added, or by some other known method such as removal with a chemical.

In this preferred embodiment, the mask 307D was removed by $O_2$ ashing using an RIE dry etching apparatus.

By using the method described above it was possible to form a gate electrode of the same shape as in the first preferred embodiment and to keep the amount by which the gate insulating film was etched to 9.5 nm.

Although in this preferred embodiment $SF_6$ was used in the etching gas in each of the second, third and fourth dry etchings, alternatively dry etching may be carried out with conditions in which $CF_4$ is used, as in the first preferred embodiment. For example, $CF_4$ may be used in the first, second and fourth dry etchings and $SF_6$ used only in the third dry etching.

And although here the description has been given using the example of a gate electrode structure having tantalum nitride as a lower layer and tungsten as an upper layer, the gate structure is not limited to this, and layers consisting of any elements selected from among tungsten, tantalum, titanium, molybdenum, silver and copper and so on, or nitrides having these elements as constituents, or alloys combining elements among these, may be suitably selected.

Third Preferred Embodiment

In this preferred embodiment, with reference to FIGS. 9A through 9E, there will be explained a method for, in the method of forming an n-channel semiconductor layer having an $L_{ov}$ region and an $L_{off}$ region in accordance with the first preferred embodiment, making the impurity concentrations of the $L_{off}$ region and the $L_{ov}$ region substantially equal by using different conditions from the first preferred embodiment in the etching of the gate electrode and changing the timing at which doping is carried out.

In the same way as in the first preferred embodiment, an insulating film 902, a crystalline island-shaped semiconductor layer 903, a gate insulating film 904, a first conducting film 905 and a second conducting film 906 are formed on a glass substrate 901, and a photoresist mask 907 is formed on this.

As in the first preferred embodiment, a TaN film was used for the lower layer of the gate electrode and a W film was used for the upper layer. And a dry etching apparatus having an ICP plasma source or an RIE dry etching apparatus was used for the dry etching of the gate electrode.

In the same way as in the first preferred embodiment, a first dry etching is carried out. The etching is conducted with $Cl_2$, $CF_4$ and $O_2$ being used for the etching gas; an ICP power of 500 W; a bias power of 150 W; an etching chamber pressure of 1.0 Pa; and flows of the gases $Cl_2$, $CF_4$ and $O_2$ of 25 sccm, 25 sccm and 10 sccm respectively.

At this time the W film gate electrode layer is etched selectively, and a first shape gate electrode layer 906A having a tapering shape of taper angle 26° formed at its edge is obtained. The TaN film gate electrode layer is etched by about 13 to 14 nm as a result of over-etching of the W film but remains present over the entire face of the substrate, constituting a first shape gate electrode layer 905A.

In the first dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

At this time, because the first shape gate electrode layer 905A is present over the entire face of the substrate, the gate insulating film is not etched and remains a first shape gate electrode layer 904A.

Then, in the same way as in the first preferred embodiment, without the resist mask being removed, a second dry etching is carried out. $Cl_2$ and $CF_4$ were used for the etching gas; the ICP power was made 500 W; the bias power was made 20 W; the chamber pressure was made 1.0 Pa; and the respective flows of the gases $Cl_2$ and $CF_4$ were each made 30 sccm. The first shape gate electrode layers 905A and 906A are etched simultaneously to form second shape gate electrode layers 905B and 906B.

At this time, the part of the gate insulating film 904A positioned outside the gate electrode layer 905B is also etched, and forms second shape gate insulating film 904B.

In the second dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

Next, in the same way as in the first preferred embodiment, a second doping is carried out. Here, the first doping is taken to be a doping carried out in the channel region for controlling the threshold characteristic of the TFT after the formation of the semiconductor layer consisting of the crystalline silicon film.

By doping with an impurity imparting the n type, source and drain regions are formed in the semiconductor layer 908. In this preferred embodiment, phosphorus was chosen as the impurity and doped at a dose of $1.5 \times 10^{15}$ atoms/cm$^2$ with an accelerating voltage of 80 kV.

Next, a third dry etching is carried out. Here also an ICP dry etching apparatus is used, and the dry etching is carried out without the resist mask being removed. $Cl_2$, $CF_4$ and $O_2$ were used for the etching gas; the ICP power was made 500 W; the bias power was made 20 W; the chamber pressure was made 1.0 Pa; and the respective flows of the gases $Cl_2$, $CF_4$ and $O_2$ were made 25 sccm, 25 sccm and 10 sccm respectively.

By etching being carried out with the conditions used in the fourth dry etching of the first preferred embodiment the W film gate electrode layer is etched selectively and a third shape gate electrode layer 906C having a larger taper angle than the first and second taper shapes is formed.

The TaN film gate electrode layer is hardly etched and remains present, but the TaN film that becomes exposed as the W film is etched in the channel length direction is gradually etched from its edge and forms a third shape 905C having an extremely small taper angle of less than 5°.

In the third dry etching, another gas selected from among chlorine gases such as $Cl_2$, $BCL_3$, $SiCl_4$ and $CCl_4$, fluorine gases such as $CF_4$, $SF_6$ and $NF_3$, and $O_2$, or a mixed gas having these as main constituents may alternatively be used.

At this time, the part of the second shape gate insulating film 904B positioned outside the second shape TaN film gate electrode layer is etched and forms a third shape gate insulating film 904C.

A third doping is then carried out. Using the third shape gate electrode layer 906C as a mask, an impurity imparting the n type is doped through the gate electrode layer 905C into the part of the semiconductor layer 909 which does not overlap with the W film gate electrode layer but does overlap with the TaN film gate electrode layer.

The edge of the third shape gate electrode layer 905C has an extremely small taper angle of less than 5°, as mentioned above, and thus its film thickness has a distribution. And in correspondence with that film thickness distribution, a slight distribution also arises in the impurity concentration obtained in the semiconductor layer as a result of the third doping; however, this is smaller than the difference in the impurity concentration between the $L_{off}$ region and the $L_{ov}$ region which arises in the first preferred embodiment.

In this preferred embodiment phosphorus was chosen as the impurity and doped to a dose of $3.5 \times 10^{12}$ atoms/cm$^2$ with an accelerating voltage of 90 kV, whereby an n-type LDD region 909 with an impurity concentration lower than that of the source and drain regions 908 is formed in the semiconductor layer 909.

A fourth dry etching is then carried out. The third shape gate electrode layer 905C is etched to form a fourth shape gate electrode layer 905D.

The edge of the third shape gate electrode layer 905C has a tapering shape, and by dry etching being carried out anisotropically the third shape TaN film gate electrode layer is gradually etched from its edge toward the position where it overlaps with the third shape-gate electrode layer 906C, so that the width of the fourth shape gate electrode layer 905D thus formed is narrower than that of the third shape gate electrode layer 905C.

As a result of the fourth dry etching, part of the LDD region 909, all of which had overlapped with the third shape gate electrode layer 905C, comes to be positioned outside the fourth shape gate electrode. Consequently, the LDD region 909 becomes an $L_{off}$ region 910 and an $L_{ov}$ region 911.

However, because the TaN film gate electrode layer is a thin film having an extremely small taper angle, if etching conditions which result in a high etching rate are used there is a possibility of the TaN film being etched away entirely.

In this preferred embodiment the fourth dry etching was carried out using a parallel flat plate type RIE dry etching apparatus and with a chamber pressure of 6.7 Pa, an RF power of 800 W, and a 35 sccm flow of $CHF_3$ as the etching gas. Here it is not particularly necessary for an RIE dry etching apparatus to be used, and alternatively an ICP dry etching apparatus may be used.

At this time almost all of the gate insulating film 904C which did not overlap with the third shape gate electrode layer 905C is etched in the fourth dry etching, but even if this gate insulating film is etched through completely this does not constitute a problem in the manufacture of the semiconductor device. The reason for this is that because $CHF_3$ is being used as the etching gas the gate insulating film can be etched selectively with respect to the silicon of the semiconductor layer. And because also when a contact hole for connecting an intermediate interconnection with the semiconductor layer is formed, in the etching of the silicon oxide nitride film which is the first interlayer insulating film in the first preferred embodiment, conditions can be used, such as $CHF_3$, such that silicon oxide nitride film is etched selectively.

When in this kind of etching with $CHF_3$ there is insufficient etching of the TaN film, etching may be carried out for 5 to 20 seconds using an etching gas of $Cl_2$, $CF_4$, and $O_2$ to pre-etch the TaN film before the etching with $CHF_3$ is carried out.

After the fourth dry etching the photoresist 907 is removed.

By applying this preferred embodiment to the first preferred embodiment it is possible to make a semiconductor device having an $L_{off}$ region and an $L_{ov}$ region using five masks, as in the first preferred embodiment, and it is possible to make a semiconductor device wherein the impurity concentrations of the $L_{off}$ region and the $L_{ov}$ region are equal.

Although here the description has been given using the example of a gate electrode structure having tantalum nitride as a lower layer and tungsten as an upper layer, the gate structure is not limited to this, and layers consisting of any elements selected from among tungsten, tantalum, titanium, molybdenum, silver and copper and so on, or nitrides having these elements as constituents, or alloys combining elements among these may be suitably selected.

Fourth Preferred Embodiment

In this preferred embodiment, with reference to FIGS. 9A through 9E, there will be explained a method for, in the forming of the gate electrode by dry etching in the third preferred embodiment, using $SF_6$ in the etching gas to obtain a higher selectivity with respect to the gate insulating film. The steps of this preferred embodiment other than the steps for forming the gate electrode are exactly the same as in the third preferred embodiment and the first preferred embodiment and therefore will not be described again here.

In the same way as in the third preferred embodiment, an insulating film 902, a crystalline island-shaped semiconductor layer 903, a gate insulating film 904, a first conducting film 905 and a second conducting film 906 are formed on a glass substrate 901, and a photoresist mask 907 is formed on this.

As in the third preferred embodiment, a TaN film was used for the lower layer of the gate electrode and an W film was used for the upper layer. And as in the third preferred embodiment a dry etching apparatus having an ICP plasma source or an RIE dry etching apparatus was used for the dry etching of the gate electrode.

A first dry etching is carried out. The etching is conducted with $Cl_2$, $CF_4$, and $O_2$ being used for the etching gas; an ICP power of 500 W; a bias power of 150 W; an etching chamber pressure of 1.0 Pa; and respective flows of the gases $Cl_2$, $CF_4$, and $O_2$ of 25 sccm, 25 sccm and 10 sccm.

At this time, the W film gate electrode layer is etched selectively, and a first shape gate electrode layer 906A having a tapering shape of taper angle 26° formed at its edge is obtained. The TaN film gate electrode layer is etched by about 13 to 14 nm as a result of over-etching of the W film but remains present over the entire face of the substrate, constituting a first shape gate electrode layer 905A.

At this time, because the first shape gate electrode layer 905A is present over the entire face of the substrate, the gate insulating film is not etched and remains a first shape gate electrode layer 904A.

$Cl_2$, $SF_6$ and $O_2$ may alternatively be used for the etching gas in the first dry etching.

Then, without the resist mask being removed, a second dry etching is carried out. $Cl_2$ and $SF_6$ were used for the etching gas; the ICP power was made 500 W; the bias power was made 10 W; the etching chamber pressure was made 1.3 Pa; and the flows of the gases $Cl_2$ and $SF_6$ were made 10 sccm and 50 sccm respectively. The first shape gate electrode layer 905A and the first shape gate electrode layer 906B are etched simultaneously and form second shape gate electrode layers 905B and 906B.

At this time, the part of the first conducting film 905A positioned outside the W film is etched for about 8 seconds. After that, to remove etching residues of the TaN film completely, an over-etching of 15 seconds is carried out. In this over-etching, the gate insulating film 904A underneath the gate electrode layer 905A is etched by 3.2 nm and becomes a second shape gate, insulating film 904B.

Next, a second doping is carried out. Here, the first doping is taken to be a doping carried out in the channel region for controlling the threshold characteristic of the TFT after the formation of the semiconductor layer.

By doping with an impurity imparting the n type, source and drain regions are formed in the semiconductor layer 908. In this preferred embodiment, phosphorus was chosen as the impurity and doped at a dose of $1.5 \times 10^{15}$ atoms/cm$^2$ with an accelerating voltage of 80 kV.

Next, a third dry etching is carried out. Here also an ICP dry etching apparatus is used, and the dry etching is carried out without the resist mask being removed. $Cl_2$, $SF_6$ and $O_2$ were used for the etching-gas; the ICP power was made 500 W; the bias power was made 10 W; the etching chamber pressure was made 1.3 Pa; and the respective flows of the gases $Cl_2$, $SF_6$ and $O_2$ were each made 20 sccm.

As a result of the bias power being made smaller than in the first dry etching, the W film gate electrode layer is etched selectively and a third shape gate electrode layer 906C having a larger taper angle than in the first and second shapes is obtained.

The TaN film gate electrode layer is hardly etched at all and remains present, but the TaN film that becomes exposed as the W film is etched in the channel length direction is gradually etched from its edge and assumes a third shape 905C having an extremely small taper angle of less than 5°.

At this time, the part of the second shape gate insulating film 904B positioned outside the TaN film gate electrode layer is etched by 37.3, and a third shape gate insulating film 904C is formed. As a result of the etching carried out so far the gate insulating film has been etched by 40.5 nm.

Whereas in the third preferred embodiment the gate insulating film was etched by about 64.4 nm in the first, second and third etchings, in this preferred embodiment, by using $SF_6$, it was possible to reduce the amount by which the gate insulating film is etched by about 42%.

Next, a third doping is carried out. Using the third shape gate electrode layer 906C as a mask, an impurity imparting the n type is doped through the gate electrode layer 905C into the part of the semiconductor layer 909 which does not overlap with the W film gate electrode layer but does overlap with the TaN film gate electrode layer.

The edge of the third shape gate electrode layer 905C has an extremely small taper angle of less than 5°, as mentioned above, and thus its film thickness has a distribution. In correspondence with that film thickness distribution, a slight distribution also arises in the impurity concentration obtained in the semiconductor layer as a result of the third doping; however, this is smaller than the difference in the impurity concentration between the $L_{off}$ region and the $L_{ov}$ region which arises in the first preferred embodiment.

In this preferred embodiment phosphorus was chosen as the impurity and doped to a dose of $3.5 \times 10^{12}$ atoms/cm$^2$ with an accelerating voltage of 90 kV, whereby an n-type LDD region 909 with an impurity concentration lower than that of the source and drain regions 908 is formed in the semiconductor layer 909.

A fourth dry etching is then carried out. The third shape gate electrode layer 905C is etched to form a fourth shape gate electrode layer 905D.

The edge of the third shape gate electrode layer 905C has a tapering shape, and by dry etching being carried out anisotropically the third shape TaN film gate electrode layer is gradually etched from its edge toward the position where it overlaps with the third shape gate electrode layer 906C, so that the width of the fourth shape gate electrode layer 905D thus formed is narrower than that of the third shape gate electrode layer 905C.

As a result of the fourth dry etching, part of the LDD region 909, all of which had overlapped with the third shape gate electrode layer 905C, comes to be positioned outside the fourth shape gate electrode. Consequently, the LDD region 909 becomes an $L_{off}$ region 910 and an $L_{ov}$ region 911.

However, because the gate electrode layer 905C is a thin film (TaN film) having an extremely small taper angle, if etching conditions which result in a high etching rate are used there is a possibility of the gate electrode layer 905C being etched away entirely.

In this preferred embodiment the fourth dry etching was carried out using a parallel flat plate type RIE dry etching apparatus and with a chamber pressure of 6.7 Pa, an RF power of 800 W, and a 35 sccm flow of $CHF_3$ as the etching gas.

At this time almost all of the gate insulating film 904C which did not overlap with the third shape gate electrode layer 905C is etched in the fourth dry etching, but even if this gate insulating film is etched through completely this does not constitute a problem in the manufacture of the semiconductor device. The reason for this is that because $CHF_3$ is being used as the etching gas the gate insulating film can be etched selectively with respect to the semiconductor layer (silicon). And because also when a contact hole for connecting an intermediate interconnection with the semiconductor layer is formed, in the etching of the silicon oxide nitride film which is the first interlayer insulating film in the first preferred embodiment, conditions can be used, such as $CHF_3$, such that silicon oxide nitride film is etched selectively.

When in this kind of etching with $CHF_3$ there is insufficient etching of the TaN film, etching may be carried out for 5 to 20 seconds using an etching gas of $Cl_2$, $CF_4$, and $O_2$ to pre-etch the TaN film before the etching with $CHF_3$ is carried out.

And $SF_6$ can be used instead of $CF_4$.

After the fourth dry etching the photoresist 907 is removed.

By using this method it was possible to form a gate electrode of the same shape as in the third preferred embodiment, and the amount by which the gate insulating film had been etched at the end of the third dry etching was kept down to 40.5 nm.

Although here the description has been given using the example of a gate electrode structure having tantalum nitride as a lower layer and tungsten as an upper layer, the gate structure is not limited to this, and layers consisting of any elements selected from among tungsten, tantalum, titanium, molybdenum, silver and copper and so on, or nitrides having these elements as constituents, or alloys combining elements among these may be suitably selected.

By using the present invention it is possible to fabricate self-aligningly a TFT having a GOLD structure and to reduce the number of masks and the number of manufacturing steps needed to make this kind of TFT. The characteristics of a semiconductor device having this TFT are improved; its manufacturing cost is reduced; the time needed to manufacture the device can be shortened; and yield can be improved.

By means of this invention it is possible to manufacture an n-channel TFT and a p-channel TFT having a GOLD structure using only five masks.

Fifth Preferred Embodiment

A TFT formed by implementing Embodiment 1 or 2 mentioned above is utilized for various electro-optical devices (active matrix liquid crystal display, active matrix EL display, active matrix EC display). Namely, the present invention can be applied to all of electronic equipments incorporating the electro-optical device in its display portion.

The following can be given as examples of such electronic equipments: a video camera; a digital camera; a projector; a head mounted display (a goggle type display); a car navigation system; a car audio system; a personal computer; a portable information terminal (such as a mobile computer, a mobile telephone, or an electronic book). Examples of those electronic equipments are shown in FIGS. 10, 11 and 12.

FIG. 10A illustrates a personal computer which includes a main body 2001, an image input portion 2002, a display portion 2003, a key board 2004, or the like. The present invention can be applied to the display portion 2003.

FIG. 10B illustrates a video camera which includes a main body 2101, a display portion 2102, an audio input portion 2103, operation switches 2104, a battery 2105, an image receiving portion 2106, or the like. The present invention can be applied to the display portion 2102.

FIG. 10C illustrates a mobile computer which includes a main body 2201, a camera section 2202, an image receiving section 2203, operation switches 2204, a display portion 2205, or the like. The present invention can be applied to the display portion 2205.

FIG. 10D illustrates a goggle type display which includes a main body 2301, a display portion 2302, and an arm section 2303. The present invention can be applied to the display portion 2302.

FIG. 10E illustrates a player using a recording medium which records a program (hereinafter referred to as a recording medium) and includes a main body 2401, a display portion 2402, a speaker section 2403, a recording medium 2404, and operation switches 2405. This player uses DVD (digital versatile disc), CD, etc. for the recording medium, and can be used for music appreciation, film appreciation, games and Internet. The present invention can be applied to the display portion 2402.

FIG. 10F illustrates a digital camera which includes a main body 2501, a display portion 2502, a view finder portion 2503, operation switches 2504, and an image receiving section (not shown in the figure). The present invention can be applied to the display portion 2502.

FIG. 11A is a front type projector which includes a projection device 2601 and a screen 2602. The present invention can be applied to the liquid crystal display device 2808 which comprises one portion of the projection device 2601 and other driving circuits.

FIG. 11B is a rear type projector which includes a main body 2701, a projection device 2702, a mirror 2703, and a screen 2704. The present invention can be applied to the liquid crystal display device 2808 which comprises one portion of the projection device 2702 and other driving circuits.

FIG. 11C is a diagram which shows an example of the structure of the projection devices 2601 and 2702 of FIGS. 11A and 11B. The projection devices 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises a plurality of optical lenses having a projection lens. Though the present embodiment shows an example of 3-plate type, the present invention is not limited to this example and a single plate type may be used for instance. Further, an operator may appropriately dispose an optical lens, a film which has a function to polarize light, a film which adjusts a phase difference and an IR film, etc in the optical path shown by an arrow in FIG. 11C.

FIG. 11D is a diagram showing an example of a structure of the optical light source system 2801 of FIG. 11C. In the present embodiment the optical light source system 2801 comprises: a reflector 2811; a light source 2812; lens arrays 2813 and 2814; a polarizer conversion element 2815; and a condenser lens 2816. Note that the optical light source system shown in FIG. 11D is merely an example and the structure is not limited to this example. For instance, an operator may appropriately dispose an optical lens, a film which has a function to polarize light, a film which adjusts a phase difference and an IR film, etc.

In the projector shown in FIG. 11, a case where a transmission type electro-optical device is used is described and a reflection type electro-optical device and an EL display device are not described.

Figure 12A:
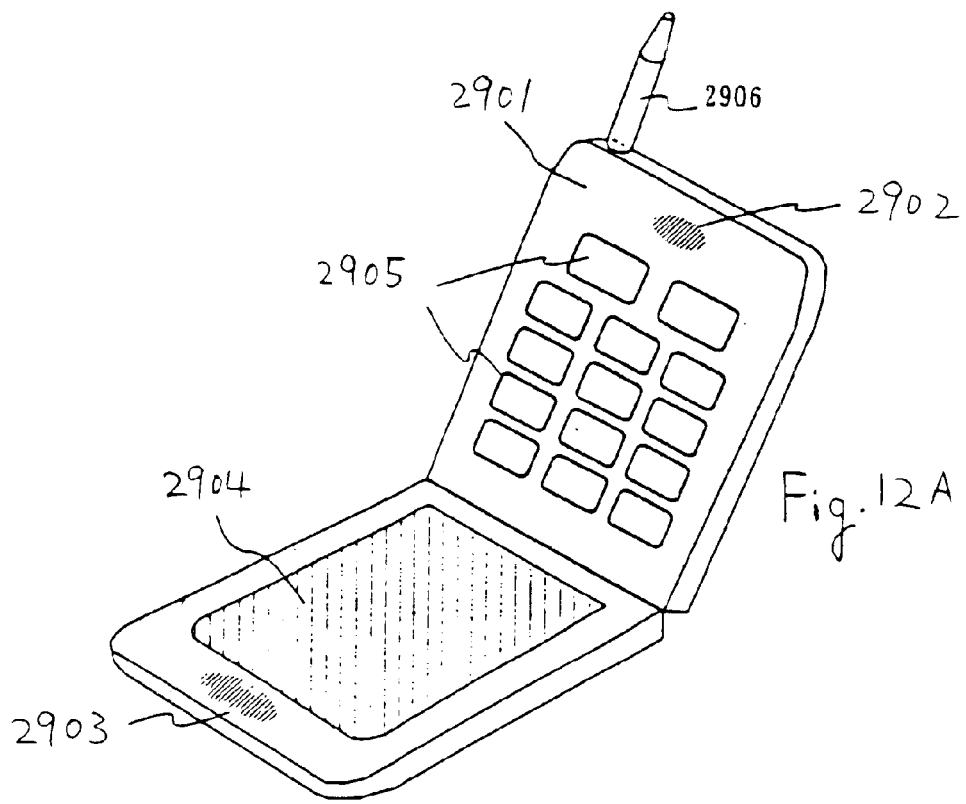
FIGS. 12A through 12C are views illustrating examples of electronic equipment.

FIG. 12A is a portable telephone which includes a main body 2901, a voice output portion 2902, a voice input portion 2903, a display portion 2904, operation switches 2905, and an antenna 2906. The present invention can be applied to the display portion 2904.

Figure 12B:
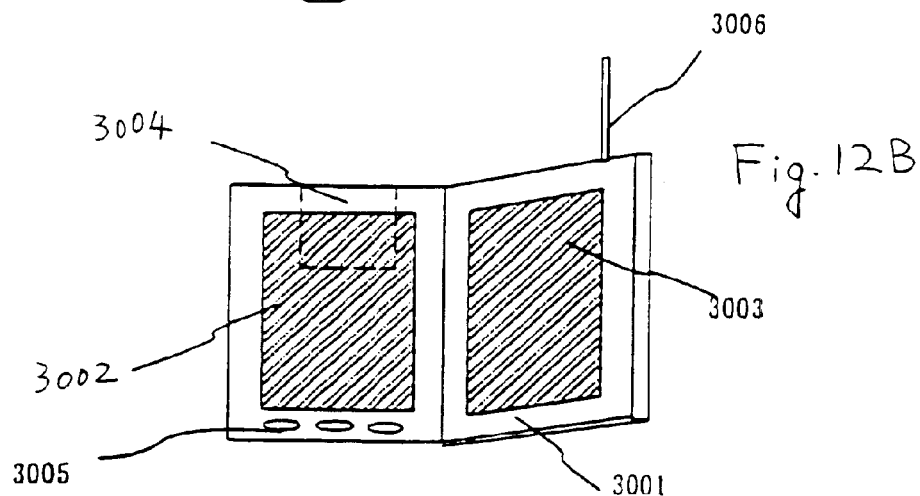

FIG. 12B is a portable electronic book which includes a main body 3001, display portions 3002 and 3003, a memory medium 3004, an operation switch 3005 and an antenna 3006. The present invention can be applied to the display portions 3002 and 3003.

Figure 12C:
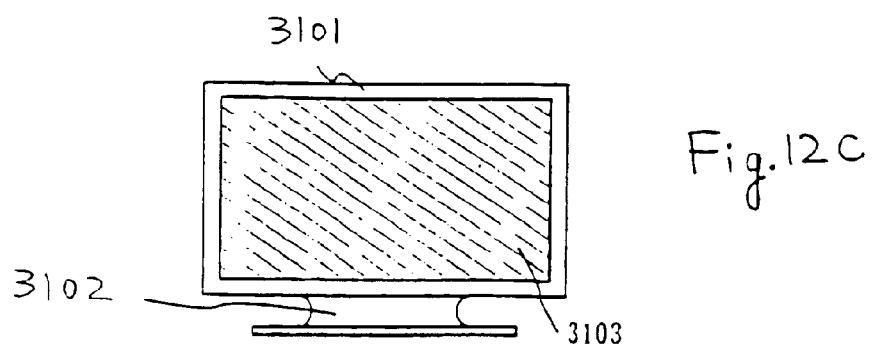

FIG. 12C is a display which includes a main body 3101, a support stand 3102, and a display portion 3103, etc. The present invention can be applied to the display portion 3103. The display of the present invention is advantageous for a large size screen in particular, such as a display equal to or greater than 10 inches (especially equal to or greater than 30 inches) in the opposite angle.

As mentioned above, the application range of the present invention is extremely wide, and the invention can be applied to electronic equipments in all fields. Further, any constitution of the electronic equipments shown in Embodiment 1 or 2 may be employed in Embodiment 5.

In the present invention, the light-shielding portion is formed from a lamination film consisting of two layers of the colored layers R+B or R+G). As a result, according to the present invention, a step of forming a black matrix can be omitted.

What is claimed is:

1. A semiconductor device comprising:
   a semiconductor layer provided over an insulating surface;
   an insulating film provided over the semiconductor layer; and
   a gate electrode provided over the insulating film,
   wherein the gate electrode has a layered structure made up of a first conducting layer constituting a lower layer and a second conducting layer constituting an upper layer and having at its edge a taper angle larger than a taper angle at the edge of the first conducting layer, and
   wherein the semiconductor layer has a channel-forming region overlapping with the second conducting layer, and has an LDD region overlapping with the first conducting layer, and has a source region and has a drain region.

2. A device according to claim 1, wherein the edge of the semiconductor layer has a tapering shape.

3. A device according to claim 2, wherein the edge of the semiconductor layer is covered by an insulating film provided between the gate electrode and the semiconductor layer.

4. A device according to claim 3, wherein the insulating film has a tapering shape in the proximity of the gate electrode.

5. A device according to claim 1, wherein said semiconductor device is incorporated into one selected from the group consisting of a personal computer, a video camera, a mobile computer, a goggle type display, a player using a recording medium, a digital camera, a front type projector, a rear type projector, a portable telephone, and a portable electronic book.

6. A display device comprising:
   a semiconductor layer provided over an insulating surface;
   an insulating film provided over the semiconductor layer; and
   a gate electrode provided over the insulating film,
   wherein the gate electrode has a layered structure made up of a first conducting layer constituting a lower layer and a second conducting layer constituting an upper layer and having at its edge a taper angle larger than a taper angle at the edge of the first conducting layer, and
   wherein the semiconductor layer has a channel-forming region overlapping with the second conducting layer, and has an LDD region overlapping with the first conducting layer, and has a source region and has a drain region.

7. A device according to claim 6, wherein the edge of the semiconductor layer has a tapering shape.

8. A device according to claim 7, wherein the edge of the semiconductor layer is covered by an insulating film provided between the gate electrode and the semiconductor layer.

9. A device according to claim 8, wherein the insulating film has a tapering shape in the proximity of the gate electrode.

10. A device according to claim 6, wherein said display device is incorporated into one selected from the group consisting of a personal computer, a video camera, a mobile computer, a goggle type display, a player using a recording medium, a digital camera, a front type projector, a rear type projector, a portable telephone, and a portable electronic book.

11. A liquid crystal display device comprising:
- a semiconductor layer provided over an insulating surface;
- an insulating film provided over the semiconductor layer; and
- a gate electrode provided over the insulating film,
- wherein the gate electrode has a layered structure made up of a first conducting layer constituting a lower layer and a second conducting layer constituting an upper layer and having at its edge a taper angle larger than a taper angle at the edge of the first conducting layer, and
- wherein the semiconductor layer has a channel-forming region overlapping with the second conducting layer, and has an LDD region over lapping with the first conducting layer, and has a source region and has a drain region.

12. A device according to claim 11, wherein the edge of the semiconductor layer has a tapering shape.

13. A device according to claim 12, wherein the edge of the semiconductor layer is covered by an insulating film provided between the gate electrode and the semiconductor layer.

14. A device according to claim 13, wherein the insulating film has a tapering shape in the proximity of the gate electrode.

15. A device according to claim 11, wherein said liquid crystal display device is incorporated into one selected from the group consisting of a personal computer, a video camera, a mobile computer, a goggle type display, a player using a recording medium, a digital camera, a front type projector, a rear type projector, a portable telephone, and a portable electronic book.

16. An EL display device comprising:
- a semiconductor layer provided over an insulating surface;
- an insulating film provided over the semiconductor layer; and
- a gate electrode provided over the insulating film,
- wherein the gate electrode has a layered structure made up of a first conducting layer constituting a lower layer and a second conducting layer constituting an upper layer and having at its edge a taper angle larger than a taper angle at the edge of the first conducting layer, and
- wherein the semiconductor layer has a channel-forming region overlapping with the second conducting layer, and has an LDD region overlapping with the first conducting layer, and has a source region and has a drain region.

17. A device according to claim 16, wherein the edge of the semiconductor-layer has a tapering shape.

18. A device according to claim 7, wherein the edge of the semiconductor layer is covered by an insulating film provided between the gate electrode and the semiconductor layer.

19. A device according to claim 18, wherein the insulating film has a tapering shape in the proximity of the gate electrode.

20. A device according to claim 16, wherein said EL display device is incorporated into one selected from the group consisting of a personal computer, a video camera, a mobile computer, a goggle type display, a player using a recording medium, a digital camera, a front type projector, a rear type projector, a portable telephone, and a portable electronic book.

* * * * *